United States Patent
Smailes

(10) Patent No.: US 11,754,079 B2
(45) Date of Patent: *Sep. 12, 2023

(54) MODULAR FAN UNIT SYSTEMS AND ASSEMBLIES

(71) Applicant: CommScope Technologies LLC, Hickory, NC (US)

(72) Inventor: Richard John Smailes, Pickering (GB)

(73) Assignee: CommScope Technologies LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/578,730

(22) Filed: Jan. 19, 2022

(65) Prior Publication Data

US 2022/0136514 A1    May 5, 2022

Related U.S. Application Data

(63) Continuation of application No. 16/843,149, filed on Apr. 8, 2020, now Pat. No. 11,261,872.

(60) Provisional application No. 62/832,470, filed on Apr. 11, 2019.

(51) Int. Cl.
| | |
|---|---|
| F04D 25/16 | (2006.01) |
| F04D 29/70 | (2006.01) |
| F04D 29/40 | (2006.01) |
| F04D 29/64 | (2006.01) |

(52) U.S. Cl.
CPC ......... *F04D 25/166* (2013.01); *F04D 29/403* (2013.01); *F04D 29/646* (2013.01); *F04D 29/703* (2013.01)

(58) Field of Classification Search
CPC .... F04D 25/166; F04D 29/403; F04D 29/542; F04D 29/646; F04D 29/703
See application file for complete search history.

(56) References Cited

U.S. PATENT DOCUMENTS

| | | | |
|---|---|---|---|
| 3,087,412 A | | 4/1963 | Holmes |
| 4,092,136 A | * | 5/1978 | Zimbardi ............... B01D 46/10 55/467 |
| 6,110,245 A | * | 8/2000 | Schlag ................. B01D 46/001 55/471 |
| 6,657,320 B1 | | 12/2003 | Andrews et al. |

(Continued)

*Primary Examiner* — Juan G Flores
*Assistant Examiner* — Jason G Davis
(74) *Attorney, Agent, or Firm* — Myers Bigel, P.A.

(57) ABSTRACT

The present disclosure describes modular fan unit systems and assemblies. A modular fan unit system assembly may include a mounting structure; and a modular fan unit system. The system may include a plurality of modular fan units, each modular fan unit having an outer housing surrounding an internal fan, the modular fan units being configured to be individually separated from the system; a filter housing unit having a plurality of filter compartments, each filter compartment configured to hold an individual air filter, wherein each modular fan unit is mounted and secured to a back side of the filter housing unit such that each modular fan unit aligns with a respective filter compartment; a plurality of louvre units, each louvre unit removably mounted to a front side of the filter housing unit such that each louvre unit aligns with a respective filter compartment; and a controller communicatively coupled with each of the modular fan units, wherein the modular fan unit system is mounted to the mounting structure.

16 Claims, 24 Drawing Sheets

(56) References Cited

U.S. PATENT DOCUMENTS

| | | | |
|---|---|---|---|
| 6,776,706 | B2 | 8/2004 | Kipka et al. |
| 6,887,149 | B2 | 5/2005 | Palmer et al. |
| 6,961,248 | B2 | 11/2005 | Vincent et al. |
| 7,597,534 | B2 | 10/2009 | Hopkins |
| 8,007,228 | B2 | 8/2011 | Wang |
| 8,152,885 | B2 | 4/2012 | Pfannenberg |
| 8,279,602 | B2 * | 10/2012 | Sivanandan ....... H05K 7/20172 361/679.48 |
| 8,432,685 | B2 * | 4/2013 | Huang ................. H05K 5/0213 165/104.33 |
| 8,727,842 | B2 | 5/2014 | Pfannenberg |
| 9,265,175 | B2 | 2/2016 | Yoshida et al. |
| 9,681,579 | B2 | 6/2017 | Barron et al. |
| 2012/0085122 | A1 | 4/2012 | Thour et al. |
| 2018/0295751 | A1 | 10/2018 | Jochim et al. |

\* cited by examiner

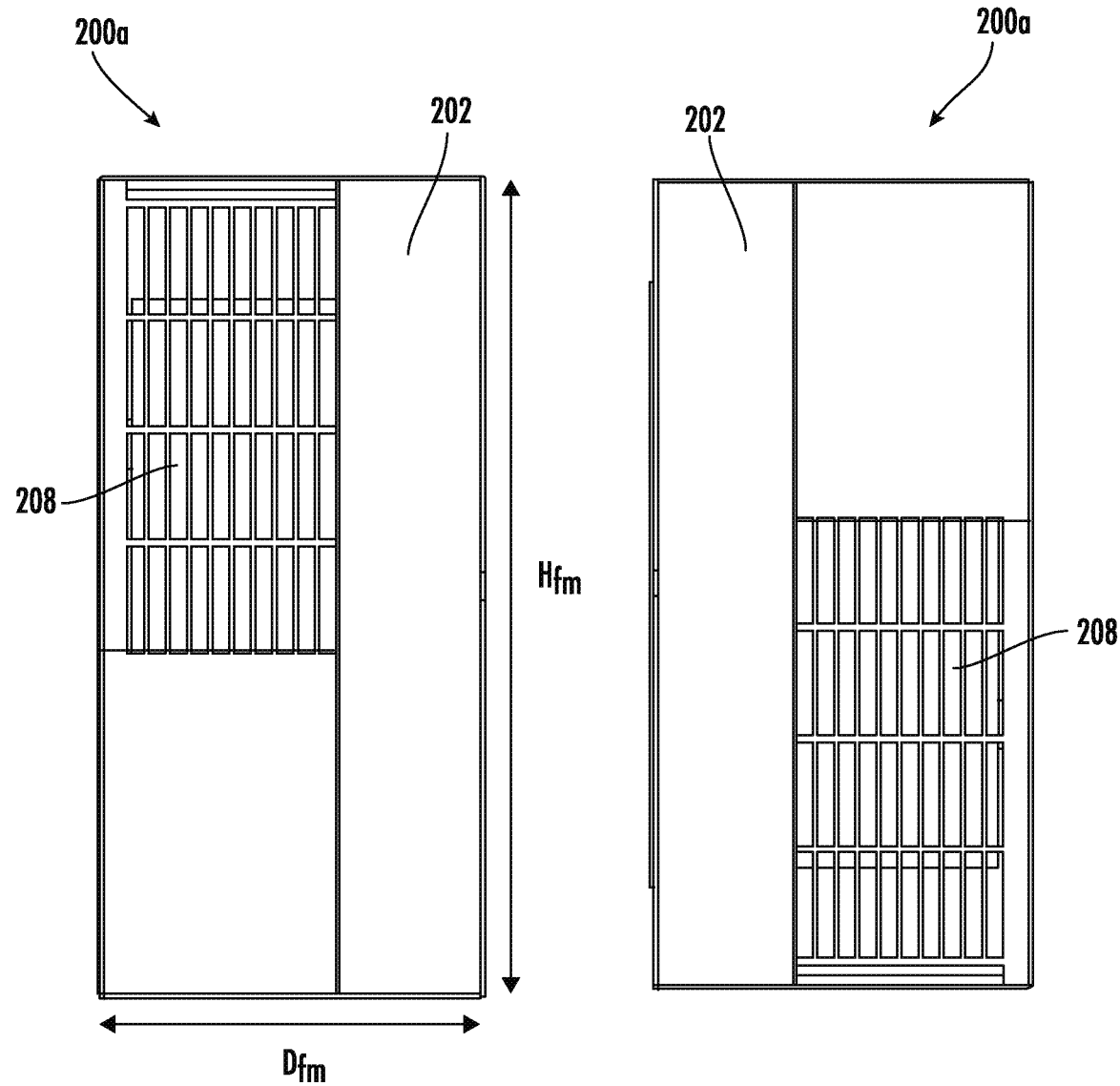

MODULAR FAN UNIT SYSTEMS AND ASSEMBLIES

RELATED APPLICATION(S)

This application is a continuation of U.S. patent application Ser. No. 16/843,149, filed Apr. 8, 2020, which claims priority from and the benefit of U.S. Provisional Application Ser. No. 62/832,470, filed Apr. 11, 2019, the disclosures of which are hereby incorporated herein in their entireties.

FIELD

The present application is directed generally toward telecommunications equipment, and more particularly, modular fan unit systems and assemblies for telecommunications cabinets.

BACKGROUND

Typically, electrical equipment housed inside a telecommunications cabinet is protected by some type of thermal management system to help maintain safe operating temperatures. The telecommunications cabinet is usually designed to keep out dust, dirt and water, but overheating is one of the single largest threats facing the electrical components housed within the cabinet. Overheating of these electrical components can lead to potential malfunctions, failure, and unplanned costly downtime. To prevent electrical components from thermal damage inside a telecommunications cabinet, cooling fans are often the most cost effective method used.

SUMMARY

A first aspect of the present invention is directed to a modular fan unit system. The system may comprise a plurality of modular fan units, each modular fan unit having an outer housing surrounding an internal fan, the modular fan units being configured to be individually separated from the system; a filter housing unit having a plurality of filter compartments, each filter compartment configured to hold an individual air filter, wherein each modular fan unit is mounted and secured to a back side of the filter housing unit such that each modular fan unit aligns with a respective filter compartment; a plurality of louvre units, each louvre unit removably mounted to a front side of the filter housing unit such that each louvre unit aligns with a respective filter compartment; and a controller communicatively coupled with each of the modular fan units.

Another aspect of the present invention is directed to a modular fan unit system assembly. The assembly may comprise a mounting structure; and a modular fan unit system. The system may comprise a plurality of modular fan units, each modular fan unit having an outer housing surrounding an internal fan, the modular fan units being configured to be individually separated from the system; a filter housing unit having a plurality of filter compartments, each filter compartment configured to hold an individual air filter, wherein each modular fan unit is mounted and secured to a back side of the filter housing unit such that each modular fan unit aligns with a respective filter compartment; a plurality of louvre units, each louvre unit removably mounted to a front side of the filter housing unit such that each louvre unit aligns with a respective filter compartment; and a controller communicatively coupled with each of the modular fan units, wherein the modular fan unit system is mounted to the mounting structure by a pair of attachment cleats, each attachment cleat being configured to interlock with the filter housing unit such that the attachment cleats apply a clamping force to the mounting structure, thereby securing the modular fan unit system to the mounting structure.

Another aspect of the present invention is directed to a louvre unit for a fan unit system. The louvre unit may comprise at least two internal blade banks, each internal blade bank having a length and a width; a plurality of blades extending the width of each internal blade bank, the ends of each blade being configured such that each end is received by and secured in a respective slot along the length of the internal blade bank; and an end cap at each end of the width of each internal blade bank, wherein the internal blade banks are layered such that the plurality of blades of the combined internal blade banks are aligned in a chevron pattern creating a labyrinth for air to pass through the louvre unit.

Another aspect of the present invention is directed to a louvre unit for a fan unit system. The louvre unit may comprise at least two internal blade banks, each internal blade bank having a length and a width; a plurality of blades extending the width of each internal blade bank, the ends of each blade being configured such that each end is received by and secured in a respective slot along the length of the internal blade bank, wherein the internal blade banks are layered such that the plurality of blades of the combined internal blade banks are aligned in a chevron pattern creating a labyrinth for air to pass through the louvre unit; an end cap at each end of the width of each internal blade bank, an outer housing configured to hold the at least two internal blade banks; and a pair of hinges coupled to the outer housing and configured to allow the louvre unit to pivot and fully withdraw from a filter housing when mounted thereto.

Another aspect of the present invention is directed to a modular fan unit system assembly. The assembly may comprise a mounting structure; and a modular fan unit system. The system may comprise a plurality of modular fan units, each modular fan unit having an outer housing surrounding an internal fan, the modular fan units being configured to be individually separated from the system; a filter housing unit having a plurality of filter compartments, each filter compartment configured to hold an individual air filter, wherein each modular fan unit is mounted and secured to a back side of the filter housing unit such that each modular fan unit aligns with a respective filter compartment; a plurality of louvre units, each louvre unit removably mounted to a front side of the filter housing unit such that each louvre unit aligns with a respective filter compartment; and a controller communicatively coupled with each of the modular fan units, wherein the modular fan unit system is mounted to the mounting structure.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim and/or file any new claim accordingly, including the right to be able to amend any originally filed claim to depend from and/or incorporate any feature of any other claim or claims although not originally claimed in that manner. These and other objects and/or aspects of the present invention are explained in detail in the specification set forth below. Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE FIGURES

FIG. 6E is a side view of the individual fan module of FIG. 6A.

FIG. 6F is an opposite side view of the individual fan module of FIG. 6A.

DETAILED DESCRIPTION

Figure 1:
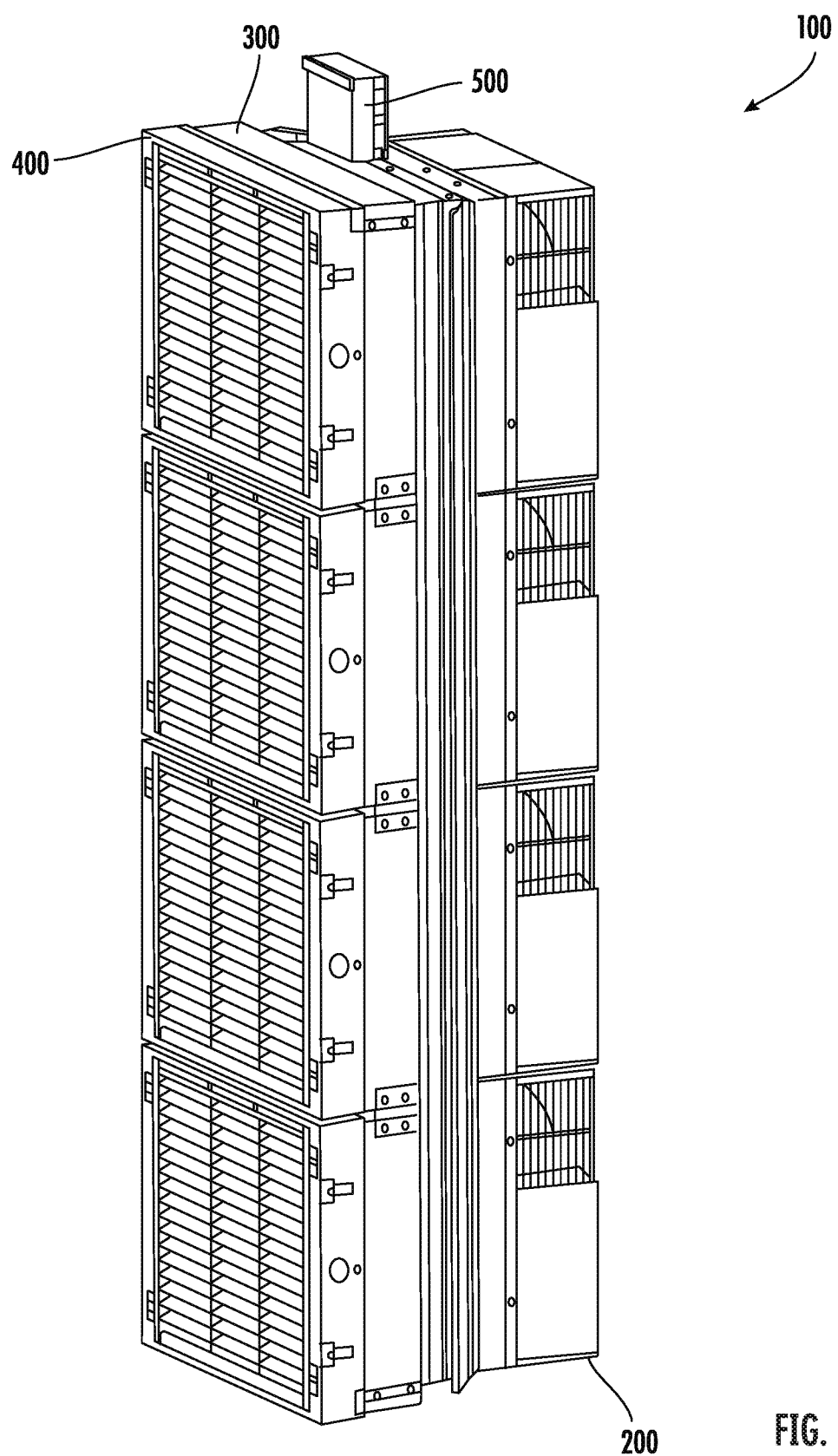
FIG. 1 is a side perspective view of a modular fan unit system according to embodiments of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The present invention now will be described more fully hereinafter with reference to the accompanying drawings, in which illustrative embodiments of the invention are shown. In the figures, certain layers, components or features may be exaggerated for clarity, and broken lines illustrate optional features or operations unless specified otherwise. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. The sequence of operations (or steps) is not limited to the order presented in the claims or figures unless specifically indicated otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Pursuant to embodiments of the present invention, modular fan unit systems and assemblies are provided that may allow for increased cooling capacity, as well as may have the capacity to replace an individual fan unit within the system without having to replace the entire system. In some embodiments, a modular fan unit system may provide modular fan units that are configured to be individually separated from the system. In some embodiments, a modular fan unit system may provide modular fan units that evenly distribute airflow within a telecommunications cabinet. In some embodiments, a modular fan unit system may provide a pair of attachment cleats that help to mount the system to a telecommunications cabinet door. In some embodiments, a modular fan unit system may provide louvre units including weldless louvre blades. In some embodiments, a modular fan unit system may provide a louvre unit having a pair of hinges that allow the louvre unit to pivot and fully withdraw from the system. Embodiments of the present invention will now be discussed in greater detail with reference to FIGS. 1-18.

Figure 2:
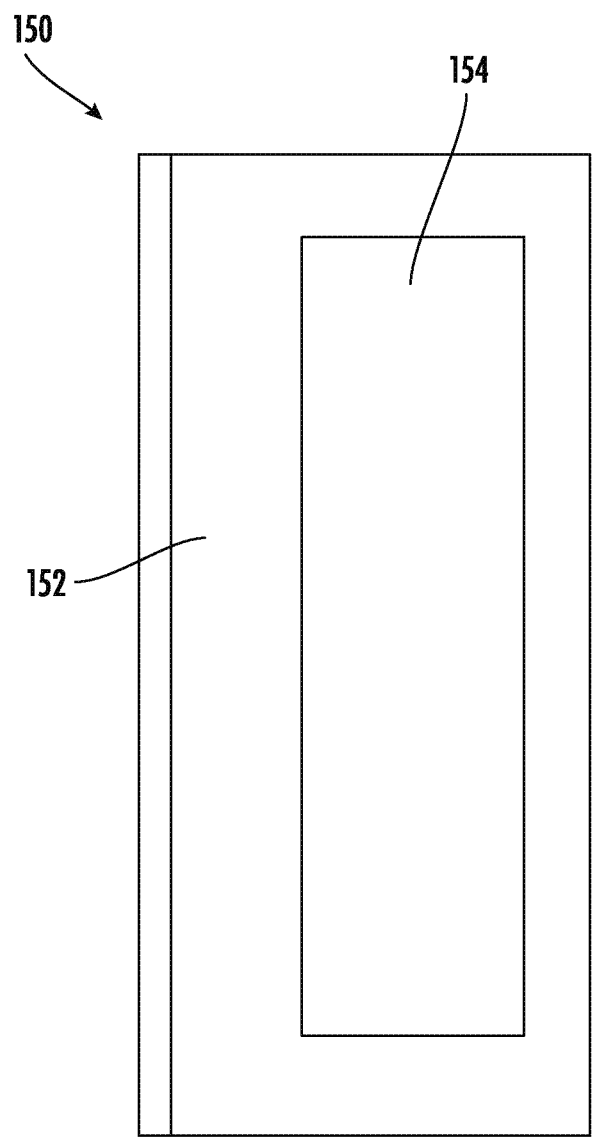
FIG. 2 is a front view of an exemplary telecommunications cabinet door that the modular fan unit of FIG. 1 may be mounted onto according to embodiments of the present invention.
Figure 3:
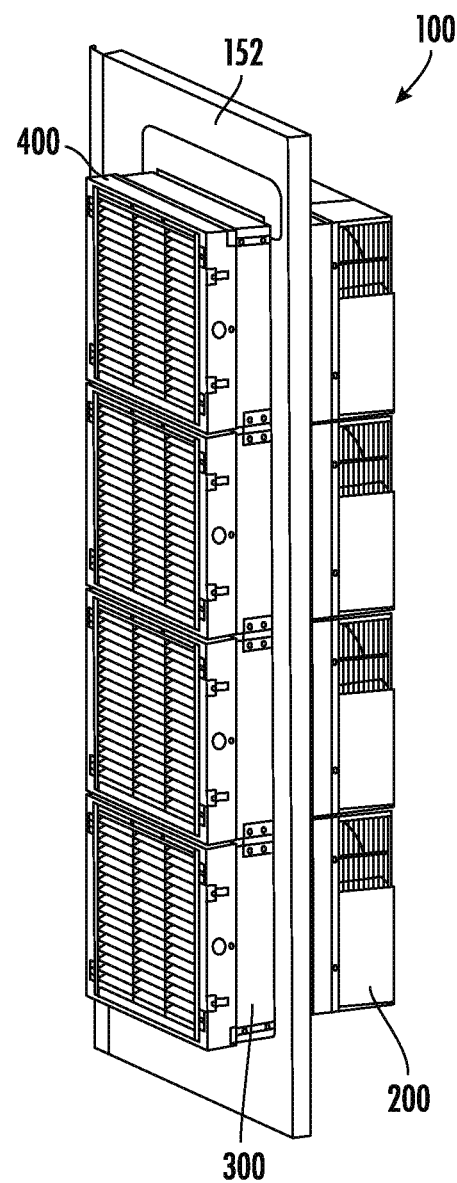
FIG. 3 is a side perspective view of the modular fan unit system of FIG. 1 mounted on the telecommunications cabinet door of FIG. 2 according to embodiments of the present invention.
Figure 4:
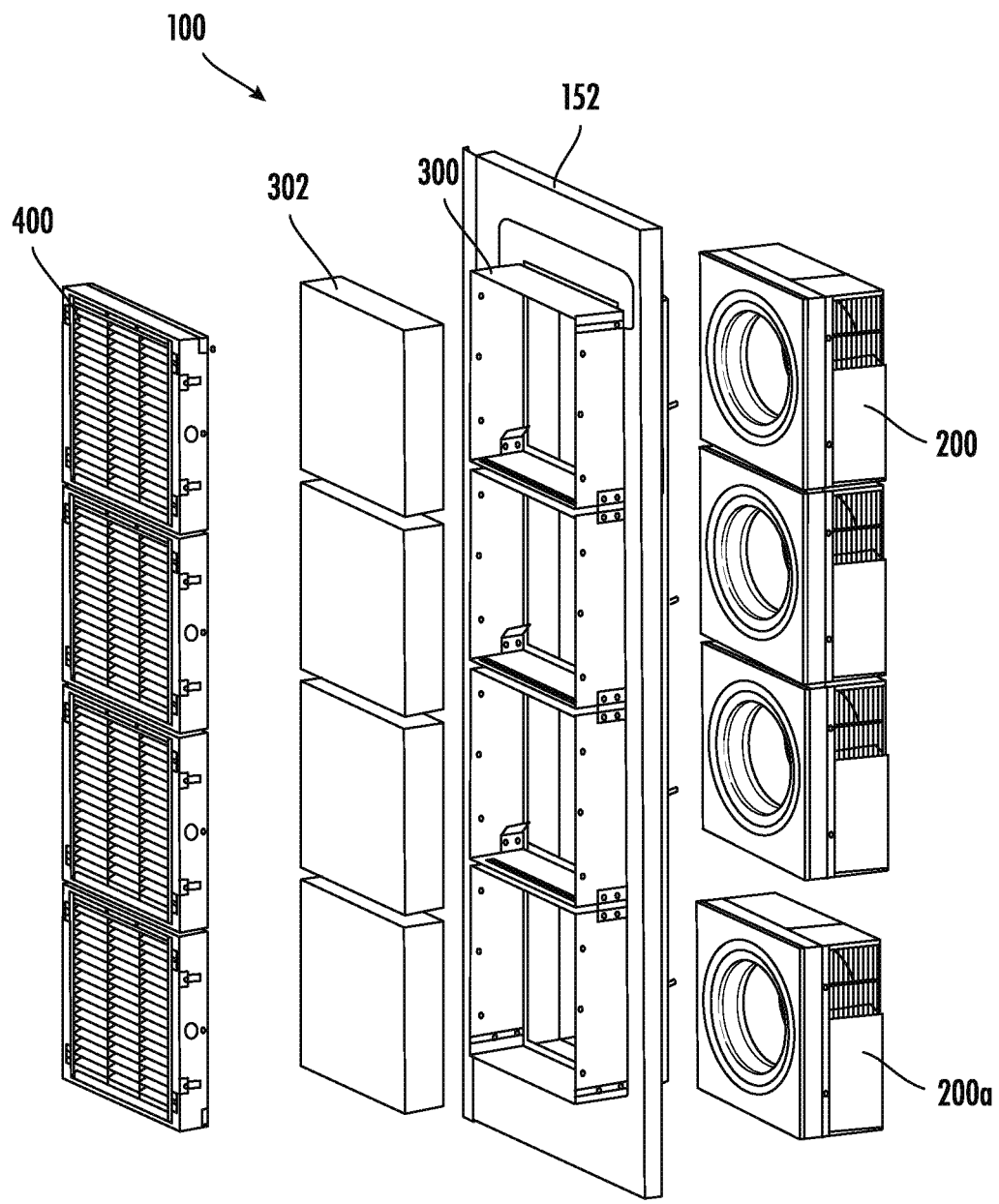
FIG. 4 is an exploded view of the modular fan unit system of FIG. 1.
Figure 5A:
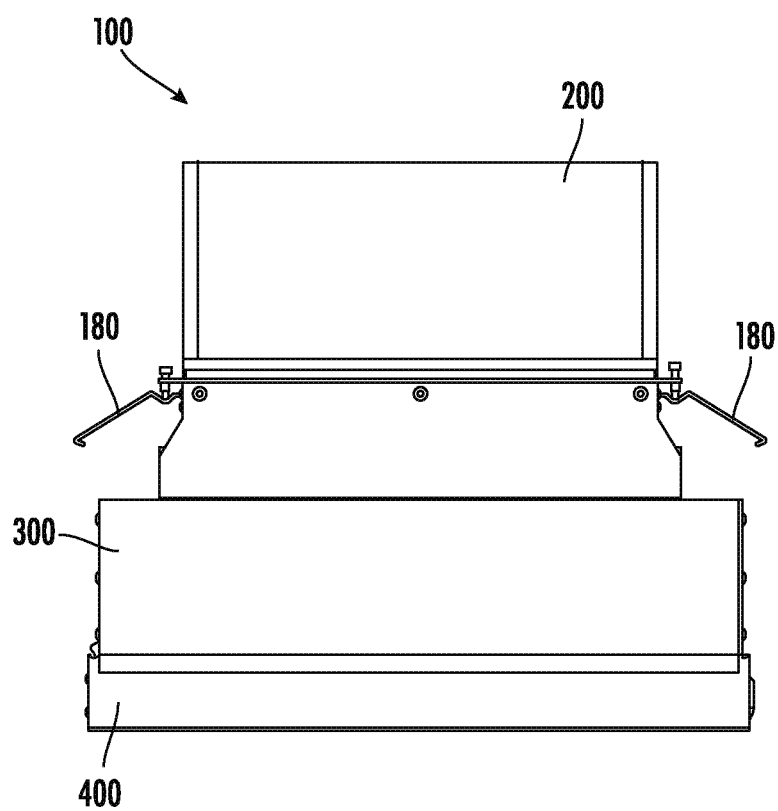
FIG. 5A is a top view of the modular fan unit system of FIG. 1.
Figure 5B:
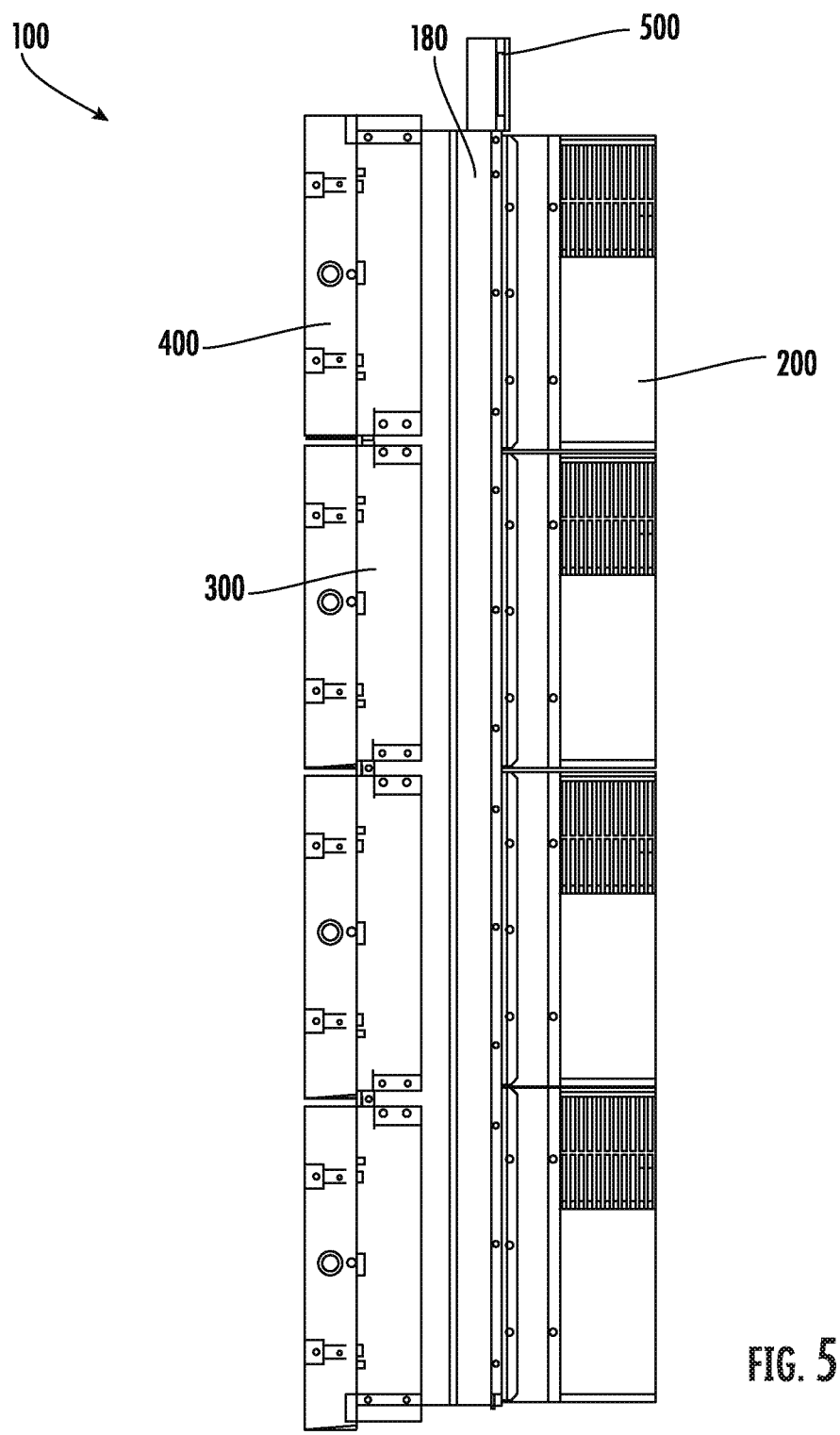
FIG. 5B is a side view of the modular fan unit system of FIG. 1.
Figure 5C:
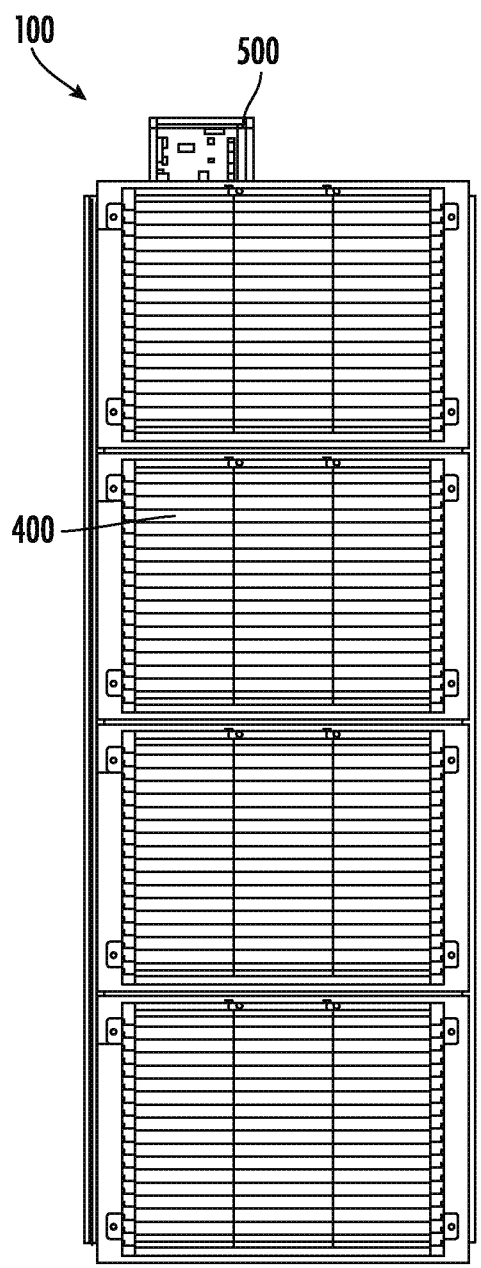
FIG. 5C is a front view of the modular fan unit system of FIG. 1.
Figure 5D:
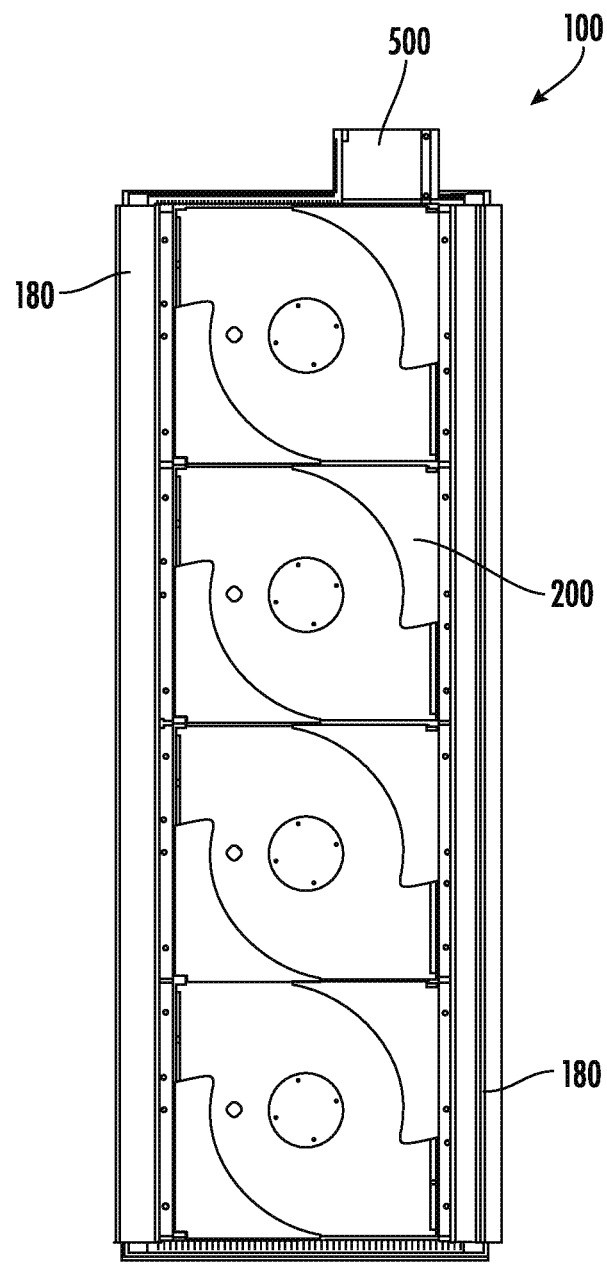
FIG. 5D is a rear view of the modular fan unit system of FIG. 1.

Referring to FIGS. 1-5D, a modular fan unit system 100 according to embodiments of the present invention is illustrated. FIG. 1 is a side perspective view of a modular fan unit system 100 according to embodiments of the present invention. In some embodiments, the system 100 may be mounted to a mounting structure 150, e.g., a telecommunications cabinet. FIG. 2 shows an exemplary mounting structure that the system 100 of the present invention may be mounted, i.e., a telecommunications cabinet door 152. As shown in FIG. 2, in some embodiments, the telecommunications cabinet door 152 has an opening 154 sized and configured to receive the modular fan unit system 100 of the present invention. FIG. 3 shows the system 100 of the present invention mounted on the telecommunications cabinet door 152 of FIG. 2. FIG. 4 is an exploded view of the system 100 of the present invention shown in FIGS. 1 and 3. FIG. 5A is a top view of a modular fan unit system 100 according to embodiments of the present invention. FIG. 5B is a side view of a modular fan unit system 100 according to embodiments of the present invention. FIGS. 5C and 5D are front and back views, respectively, of a modular fan unit system 100 according to embodiments of the present invention.

As best shown in FIG. 1 and FIG. 4, in some embodiments, a modular fan unit system 100 of the present invention may comprise a plurality of modular fan units 200, a filter housing unit 300, a plurality of louvre units 400, and a controller 500. Each of these will be discussed in further detail below.

Figure 6A:
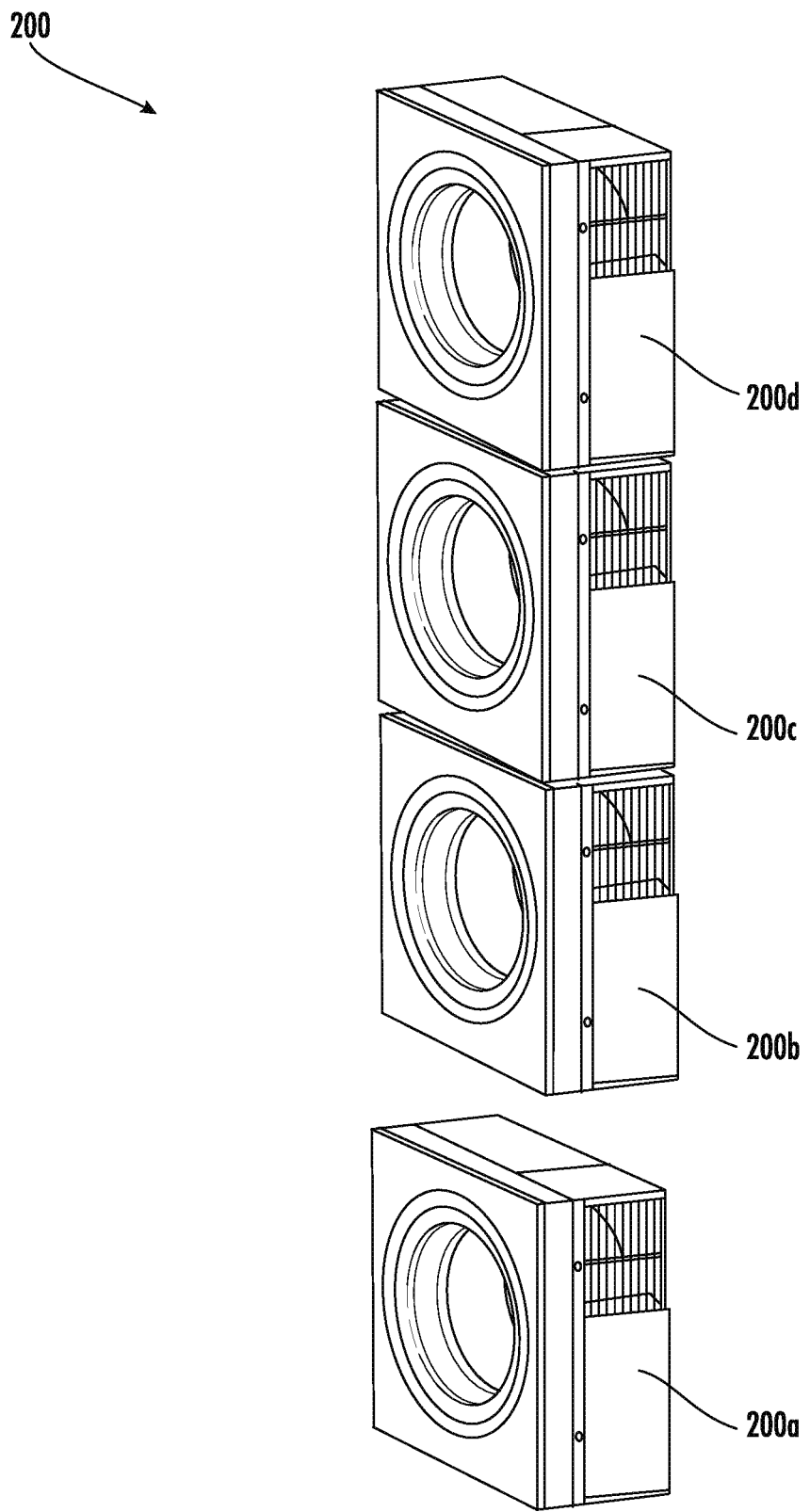
FIG. 6A is a side, partial exploded, perspective view of the plurality of fan modules and controller of the modular fan unit system of FIG. 1 according to embodiments of the present invention.

Referring now to FIGS. 6A-6F, the modular fan unit system 100 of the present invention may comprise a plurality of modular fan units 200. In some embodiments, the system 100 may comprise two or more modular fan units 200. For example, as shown in FIG. 6A, in some embodiments, the present invention may comprise four modular fan units 200a-d. In some embodiments, each modular fan unit 200a-d may be communicatively coupled to a controller 500. When the system 100 is mounted on a mounting structure 150 (e.g., the door 152 of a telecommunications cabinet), the plurality of modular fan units 200 are mounted on or are adjacent to the back side of the door 152 such that the modular fan units 200 are within the interior cavity of the telecommunications cabinet 150 (see, e.g., FIGS. 3 and 7).

Figure 6B:
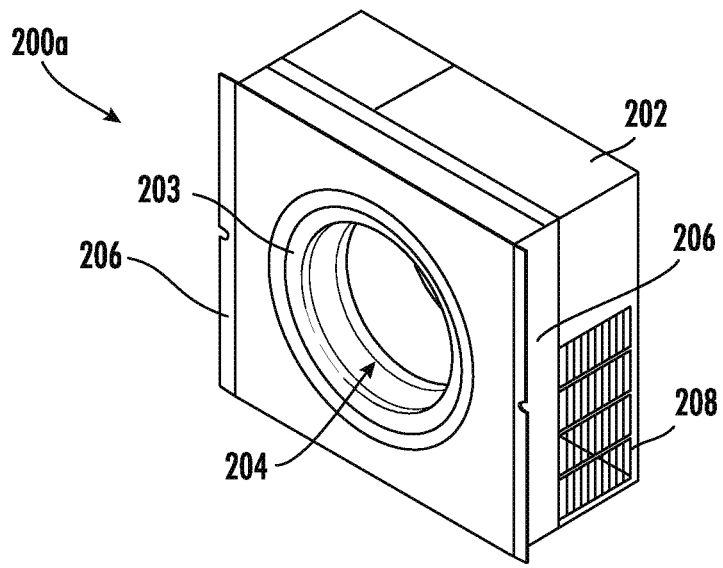
FIG. 6B is a side perspective view of an individual fan module of the plurality of fan modules of FIG. 6A according to embodiments of the present invention.
Figure 6C:
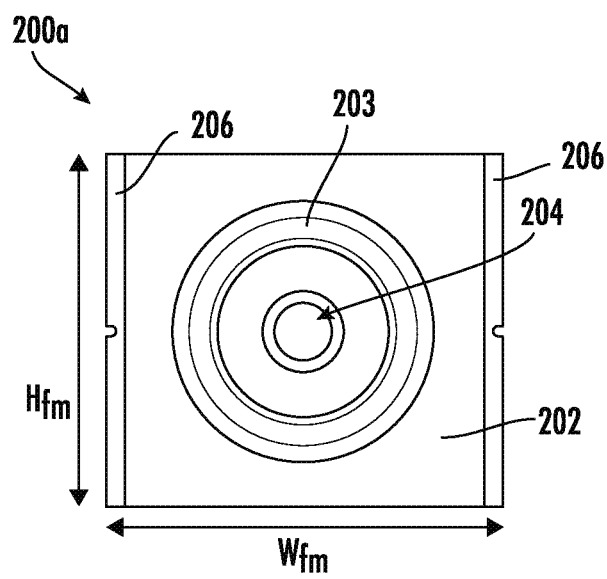
FIG. 6C is a front view of the individual fan module of FIG. 6A.
Figure 6D:
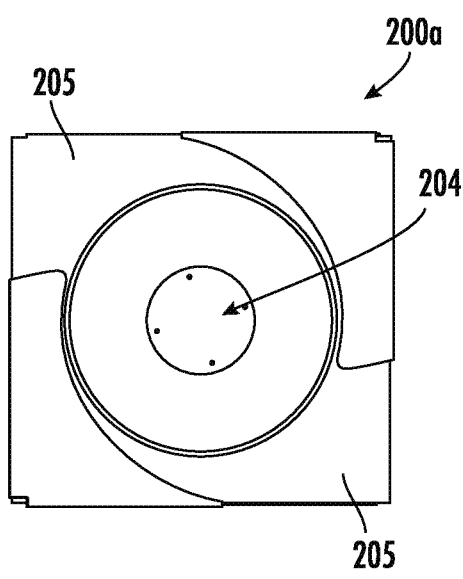
FIG. 6D is a back view of the individual fan module of FIG. 6A without the outer housing.

As shown in FIGS. 6B-6D, each modular fan unit 200a-d has an outer housing 202 that surrounds an internal fan 204. Each internal fan 204 may comprise an inlet flare 203 and outlet scrolls 205 which may improve efficiency of the modular fan unit 200a-d. The outer housing 202 of the modular fan unit 200a-d may include one or more flanges 206 that extend outwardly from the outer housing 202. The flanges 206 may be configured to secure each modular fan unit 200a-d to the filter housing unit 300. This will be discussed in further detail below. Additionally, the outer housing 202 of each modular fan unit 200a-d further comprises one or more vents (or air outlets) 208. As shown in FIGS. 6E and 6F, the vents 208 may reside on one or more sides of each modular fan unit 200a-d.

Figure 7:
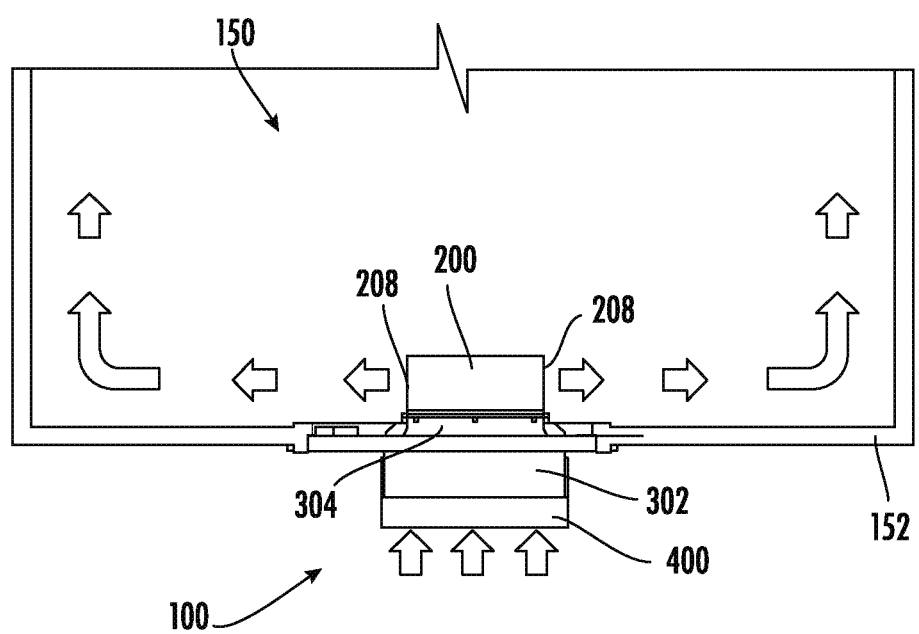
FIG. 7 is a schematic illustration showing an exemplary distribution of airflow from the fan module of FIG. 6A according to embodiments of the present invention.

In some embodiments, the vents 208 may help to direct the flow of air generated by the internal fans 204 within a telecommunications cabinet 150. In some embodiments, the vents 208 of each modular fan unit 200a-d may be configured to distribute airflow evenly within the telecommunications cabinet 150. For example, as illustrated in FIG. 7, in some embodiments, each internal fan 202 (in combination with the vents 208) may distribute airflow evenly within the telecommunications cabinet 150 from opposing sides of each modular fan unit 200a-d. In some embodiments, the positioning of the vents 208 on the sides of the modular fan unit 200a-d may contribute to the even distribution of airflow within the telecommunications cabinet 150. For example, as shown in FIGS. 6E and 6F, the vent 208 on one side of the modular fan unit 200a-d may be located at different height than the vent 208 on the opposite side of the modular fan unit 200a-d (i.e., the vent 208 on one side is closer to the top of the unit 200a-d (FIG. 6E) compared to the vent 208 on the opposite side that is closer to the bottom of the unit 200a-d (FIG. 6F)).

In some embodiments, each modular fan unit 200a-d has rotational symmetry 180° about a rotational axis of the internal fan 202. For example, if a modular fan unit 200a-d is mounted upside down, the position of the air vents 208 will still be in the same place. The only exception to this symmetry is the off-axis location of a cable entry for the fan motor (not shown). In some embodiments, the modular fan units 200a-d may be mounted in an orientation that may allow for the most optimal cable routing. The distribution of airflow of the modular fan unit system 100 of the present invention is distinguishable from existing fan systems because existing fan systems move air throughout an enclosed space without directing the airflow within the space. These fan systems may have air outlets (vents) on both sides of a fan unit, but the internal fans lack internal scrolling, which allows the impeller of the fan unit to work in free air. This, however, may result in an uneven distribution of air throughout the enclosed space. For example, distribution of air may be heavily biased to the right side of the enclosed space and/or air flow from the lowest fan may be directed to the floor of the enclosed space.

In contrast, the modular fan units 200a-d having the dual symmetrical air vents 208 (and symmetrical scrolling) of the present invention may allow air to exit the modular fan units 200a-d at a higher velocity and be directed outwardly to the sides of the telecommunications cabinet 150 making the cooling air provided by the system 100 more likely to pass over equipment mounted along the side walls of the telecommunications cabinet 150. Thus, the system 100 of the present invention may allow for more efficient cooling of the electrical equipment/components stored within a telecommunications cabinet 150 over existing fan systems.

Each modular fan unit 200a-d may be substantially square in shape having a height ($H_{fm}$), a width ($W_{fm}$), and a depth ($D_{fm}$). The system 100 of the present invention may be configured to accommodate modular fan units 200a-d of varying sizes. For example, in some embodiments, each modular fan unit 200a-d may have a height ($H_{fm}$) in the range of about 400 mm to about 500 mm, a width ($W_{fm}$) in the range of about 350 mm to about 450 mm, and a depth ($D_{fm}$) in the range of about 175 mm to about 200 mm. In some embodiments, the plurality of fan modules 200a-d may provide enough mass airflow to remove about 10 kW to about 20 kW of heat (at standard atmospheric conditions) from the electrical equipment/components stored within the telecommunications cabinet 150. For example, in some embodiments, a system 100 comprising three modular fan units 200a-c may provide enough mass airflow to remove 12 kW of heat from within a telecommunications cabinet 150. In some embodiments, a system 100 comprising four modular fan units 200a-d may provide enough mass airflow to remove 18 kW of heat from within a telecommunications cabinet 150.

As shown in FIG. 6A, each modular fan unit 200a-d is a separate, individual unit that may be configured to be stackable with another modular fan unit 200a-d. As discussed in further detail below, in some embodiments, each modular fan unit 200a-d may be secured to the telecommunications cabinet door 152 with a plurality of bolts 170. In some embodiments, the modular fan unit 200a-d may be further secured to each other when in a stacked relationship. In some embodiments, the modular fan units 200a-d may be secured individually to the telecommunications cabinet 150 or the plurality of modular fan units 200 may be secured to the telecommunications cabinet 150 as a unit. As shown in FIG. 6A, each modular fan unit 200a-d is configured to be individually separated and removed from the system 100. Advantageously, this allows a technician the ability to replace or repair a malfunctioning individual modular fan unit 200a-d without having to dismantle or remove the entire system 100 from the telecommunications cabinet 150.

Figure 8A:
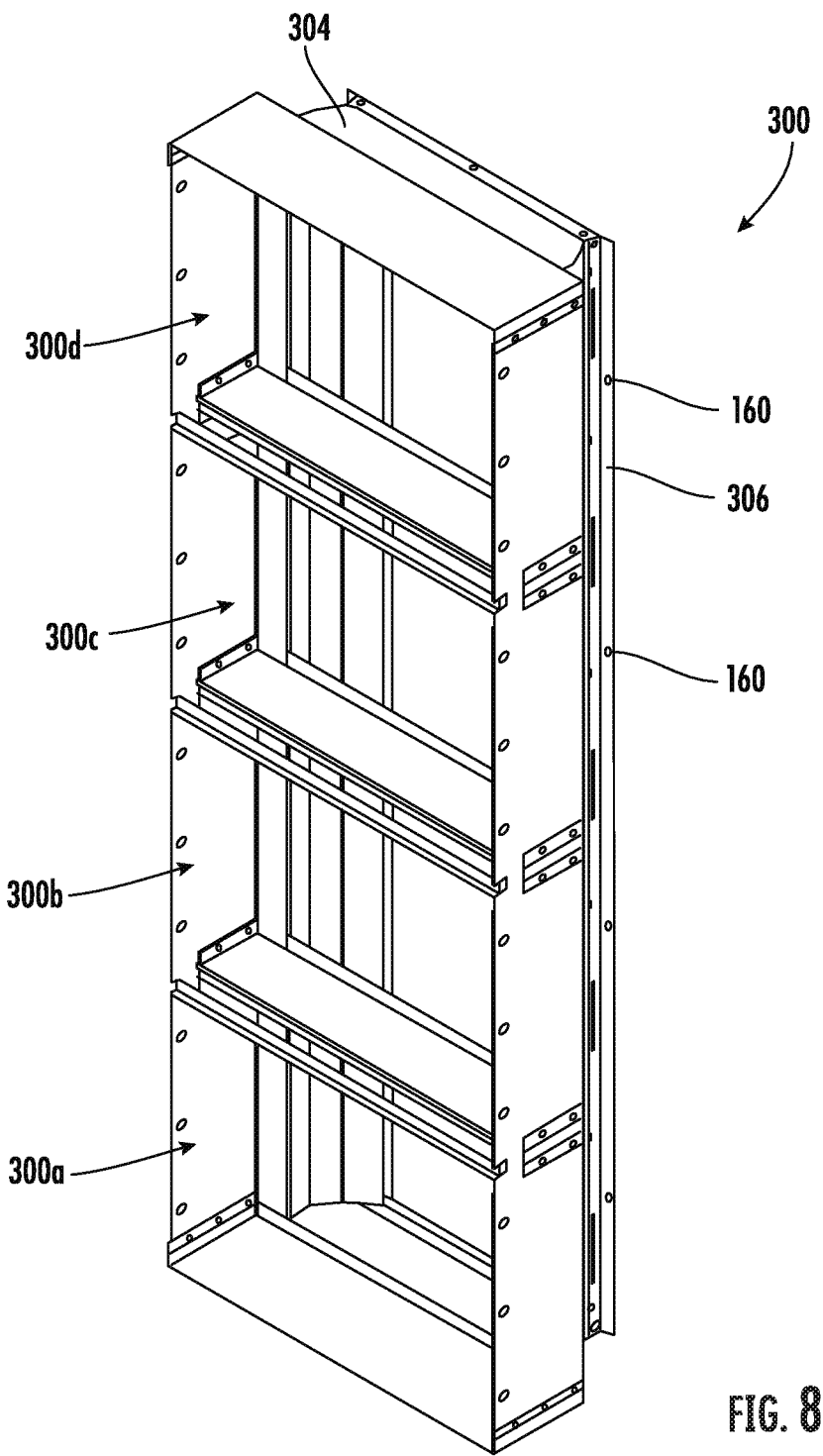
FIG. 8A is a side perspective view of a filter housing of the modular fan unit system of FIG. 1 according to embodiments of the present invention.
Figure 8B:
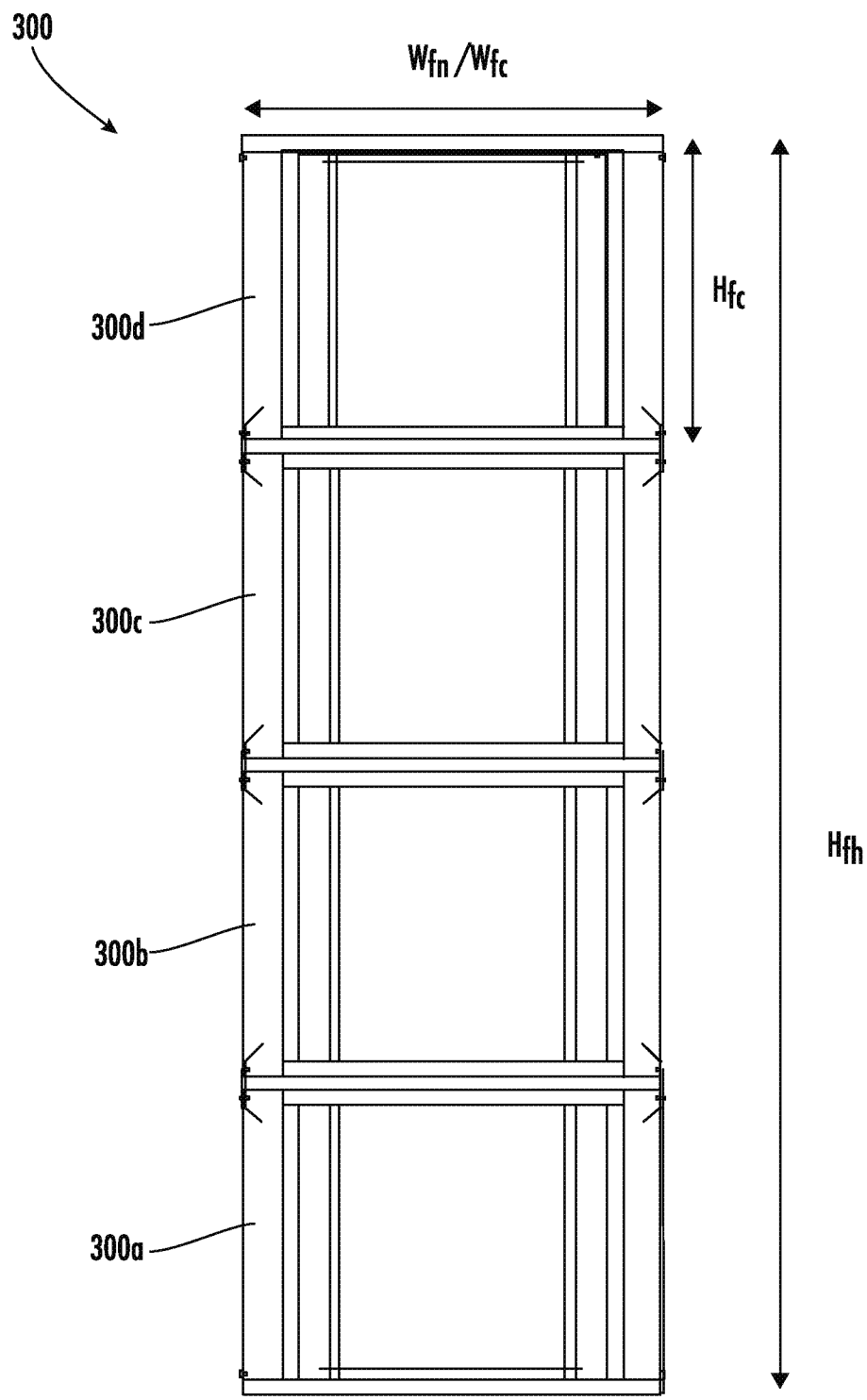
FIG. 8B is a front view of the filter housing of FIG. 8A.
Figure 8C:
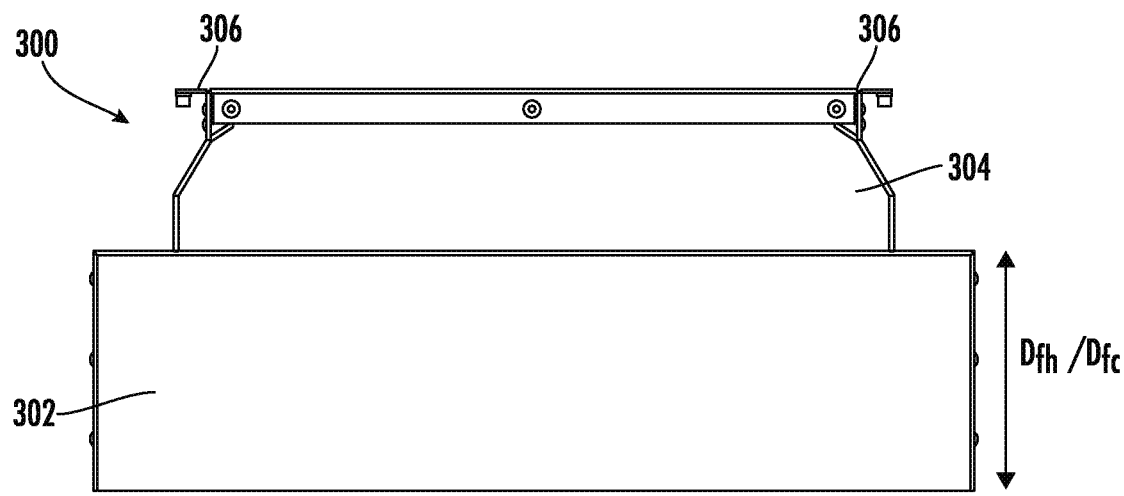
FIG. 8C is a top view of the filter housing of FIG. 8A.
Figure 9:
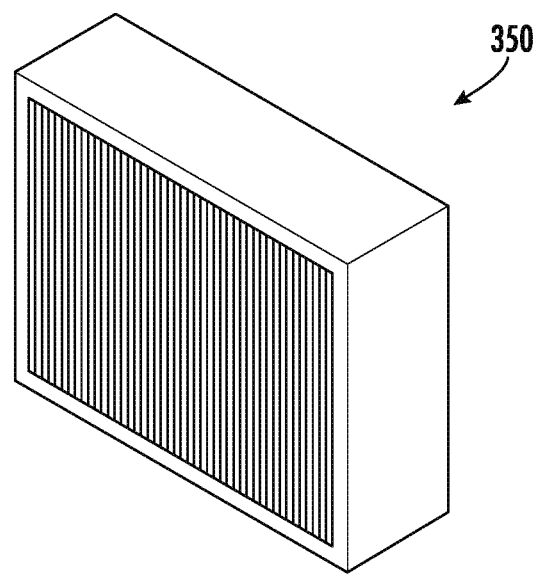
FIG. 9 is a side perspective view of an exemplary air filter unit for the modular fan unit system of FIG. 1 according to embodiments of the present invention.

Referring to FIGS. 8A-8C, in some embodiments, the system 100 of the present invention further comprises a filter housing unit 300. The filter housing unit 300 has a height ($H_{fh}$), a width ($W_{fh}$), and a depth ($D_{fh}$). In some embodiments, the filter housing unit 300 may have a height ($H_{fh}$) in the range of about 1600 mm to about 1700 mm, a width ($W_{fh}$) in the range of about 500 mm to about 600 mm, and a depth ($D_{fh}$) in the range of about 75 mm to about 125 mm.

As shown in FIGS. 8A and 8B, in some embodiments, the filter housing unit 300 may comprise one or more individual filter compartments 300a-d. Each filter compartment 300a-d may correspond to a respective modular fan unit 200a-d. The filter compartments 300a-d have a height ($H_{fc}$), a width ($W_{fc}$), and a depth ($D_{fc}$). In some embodiments, each filter compartment 300a-d may have a height (HO in the range of about 375 mm to about 425 mm, a width ($W_{fc}$) in the range of about 525 mm to about 575 mm, and a depth ($D_{fc}$) in the range of about 75 mm to about 125 mm. Each filter compartment 300a-d is configured to receive and hold an air filter 350 (see, e.g., FIG. 9). The air filters 350 used with the present invention may be similar to the standard air filters used with existing fan systems but are sized such that they may fit within the filter compartments 300a-d of the system 100.

Referring to FIG. 8C, the filter housing unit 300 comprises a main body 302 that includes an extended portion 304. The extended portion 304 may be coupled to or integral with the main body 302 of the filter housing unit 300. As discussed above, in some embodiments, each modular fan unit 200a-d may be secured to the filter housing unit 300. For example, in some embodiments, the extended portion 304 of the filter housing unit 300 may comprise one or more outwardly extending mating flanges 306. The flanges 306 may comprise a plurality of apertures 160 that are each configured to receive a respective bolt 170 to secure each modular fan unit 200a-d to the filter housing unit 300. For example, in some embodiments, the flanges 206 of each modular fan unit 200a-d may be aligned with and secured to the flanges 306 of the filter housing unit 300. Any suitable known method of attaching each modular fan unit 200a-d to the filter housing unit 300 may be used.

In some embodiments, the extended portion 304 of the main body 300 is configured such that the extended portion 304 may be inserted through an opening 154 in a telecommunications cabinet door 152 (see, e.g., FIG. 2). For example, as shown in FIG. 3 and FIG. 7, when the filter housing unit 300 is mounted and secured to the front side of the telecommunications cabinet door 152, i.e., the main body 302 of the filter housing unit 300 is located on the outside of the telecommunications cabinet 150 and the extended portion 304 of the filter housing unit 300 extends through the telecommunications cabinet door 152 such that the flanges 306 are adjacent the back side of the telecommunications cabinet door 152. In some embodiments, the extended portion 304 may be tapered from the main body 302 to the flanges 306. The tapered shape helps to direct airflow from the air filters 350 to the internal fans 202 within the modular fan units 200a-d. This may allow for the modular fan unit system 100 to operate more efficiently.

Referring to FIGS. 10A-11C, in some embodiments, the modular fan unit system 100 of the present invention may be further secured to the mounting structure 150 (e.g., the telecommunications cabinet door 152) by a pair of attachment cleats 180 which clamp the filter housing unit 300 to the mounting structure 150. In some embodiments, each attachment cleat 180 may be configured to interlock with the extended portion 304 of the filter housing unit 300 such that the attachment cleats 180 apply a clamping force $F_c$ to the mounting structure 150, thereby securing the filter housing unit 300 to the mounting structure 150. In some embodiments, each attachment cleat 180 comprises a plurality of locking members 182 configured to be received through a plurality of slots 184 in the extended portion 304 of the filter housing unit 300 to interlock the filter housing unit 300 to the mounting structure 150.

Figure 10A:
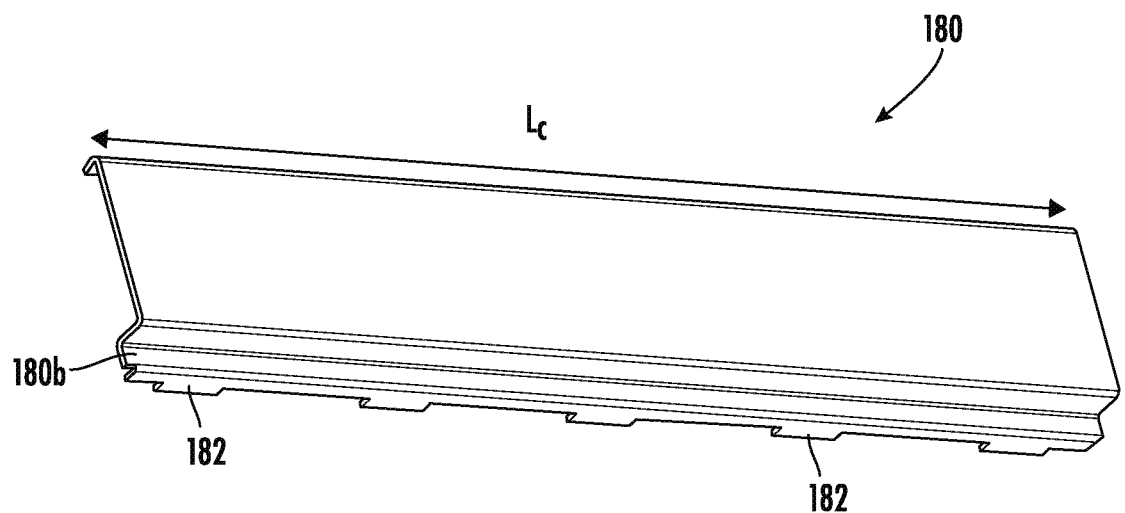
FIG. 10A is a top perspective view of an attachment cleat according to embodiments of the present invention.
Figure 10B:
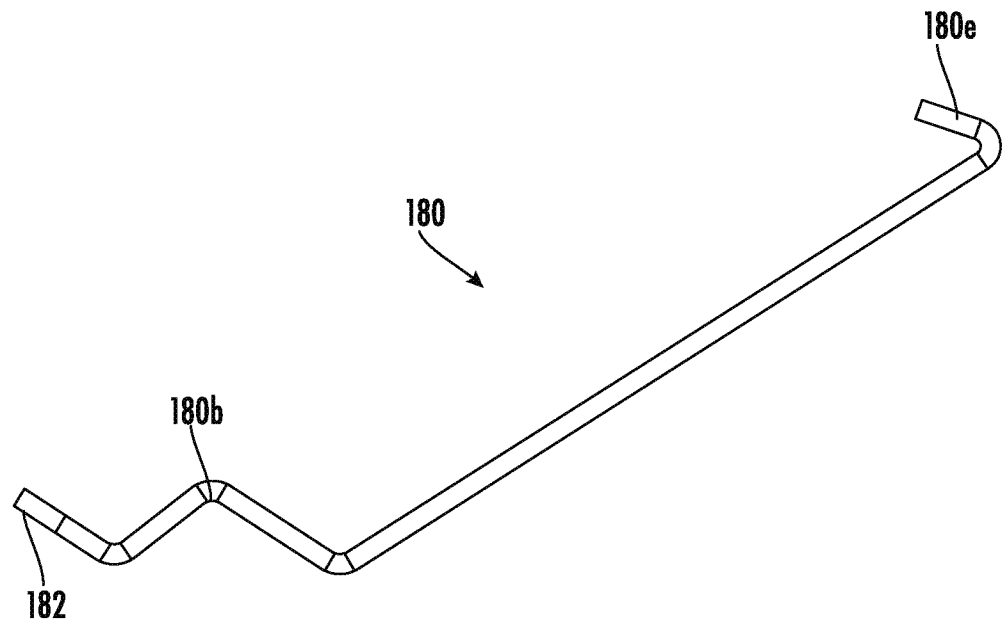
FIG. 10B is a side view of the attachment cleat of FIG. 10A.
Figure 11A:
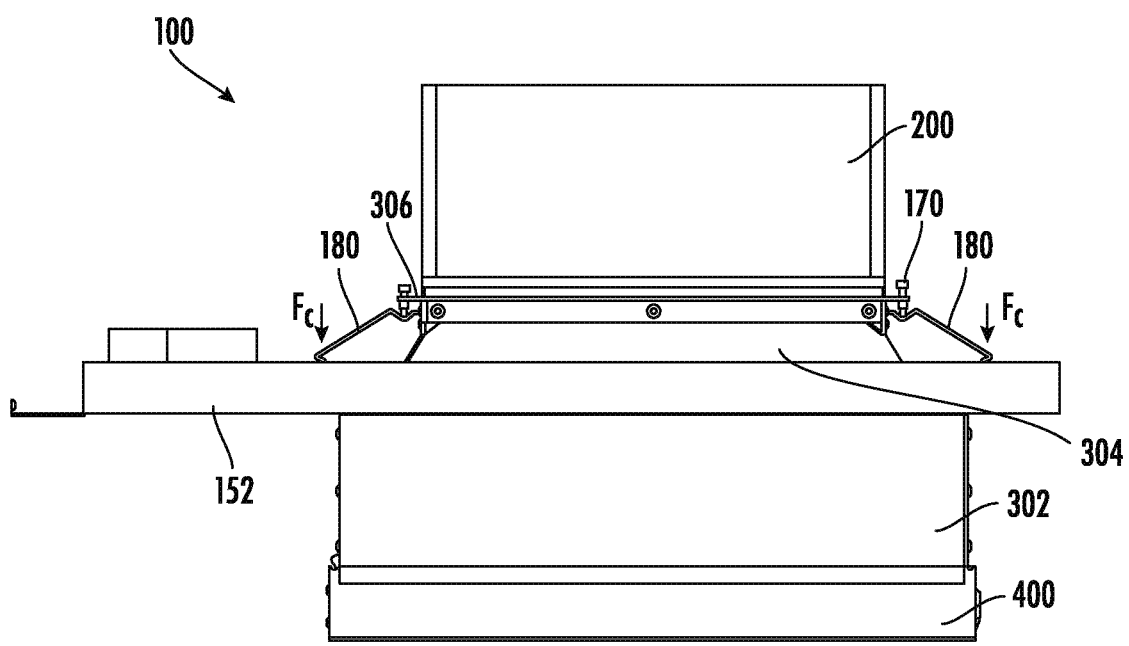
FIG. 11A is a top view of the attachment cleat of FIG. 10A securing the modular fan unit system of FIG. 1 to the telecommunications cabinet of FIG. 2 according to embodiments of the present invention.
Figure 11B:
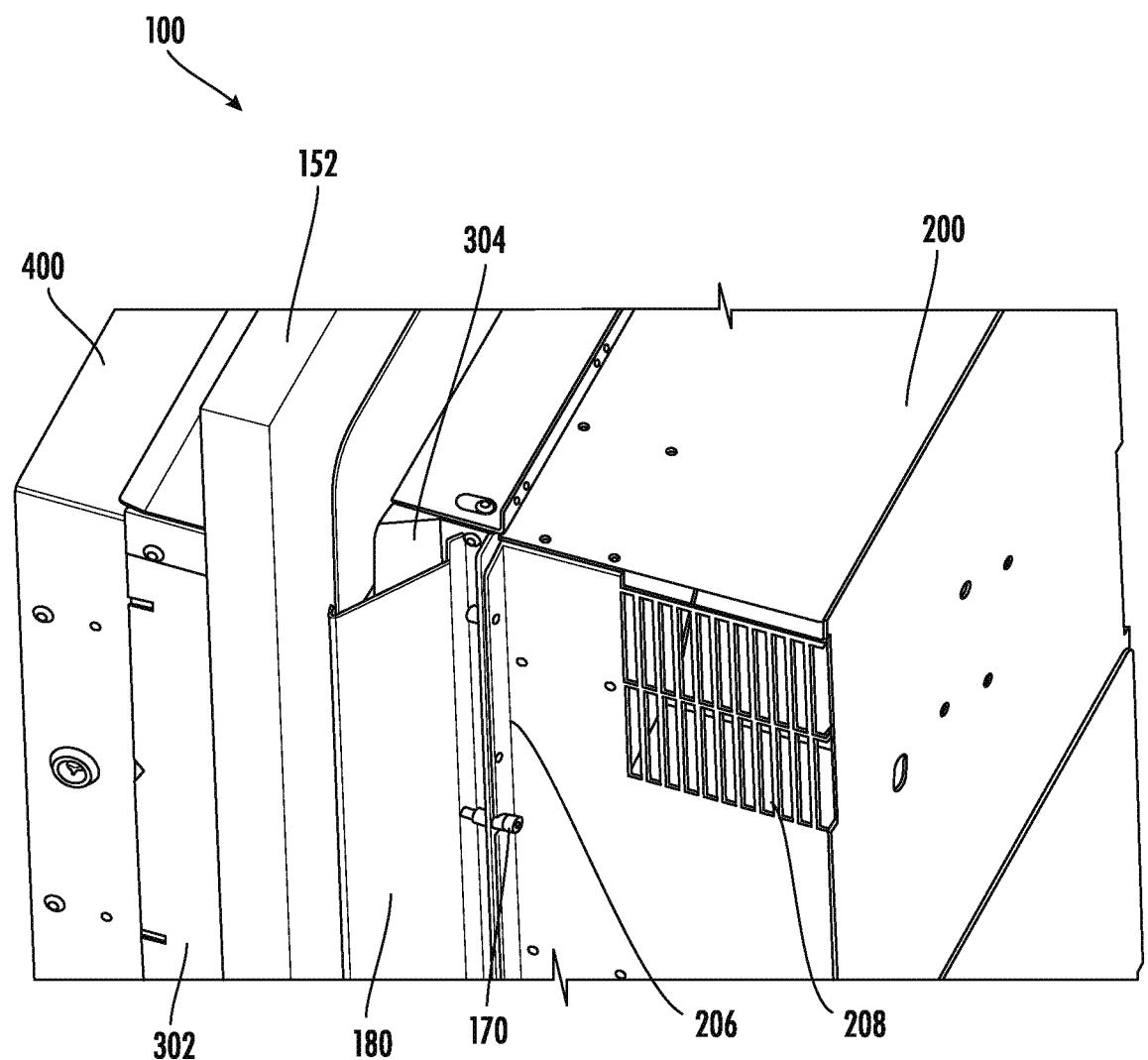
FIG. 11B is an enlarged side perspective view of the attachment cleat of FIG. 11A.
Figure 11C:
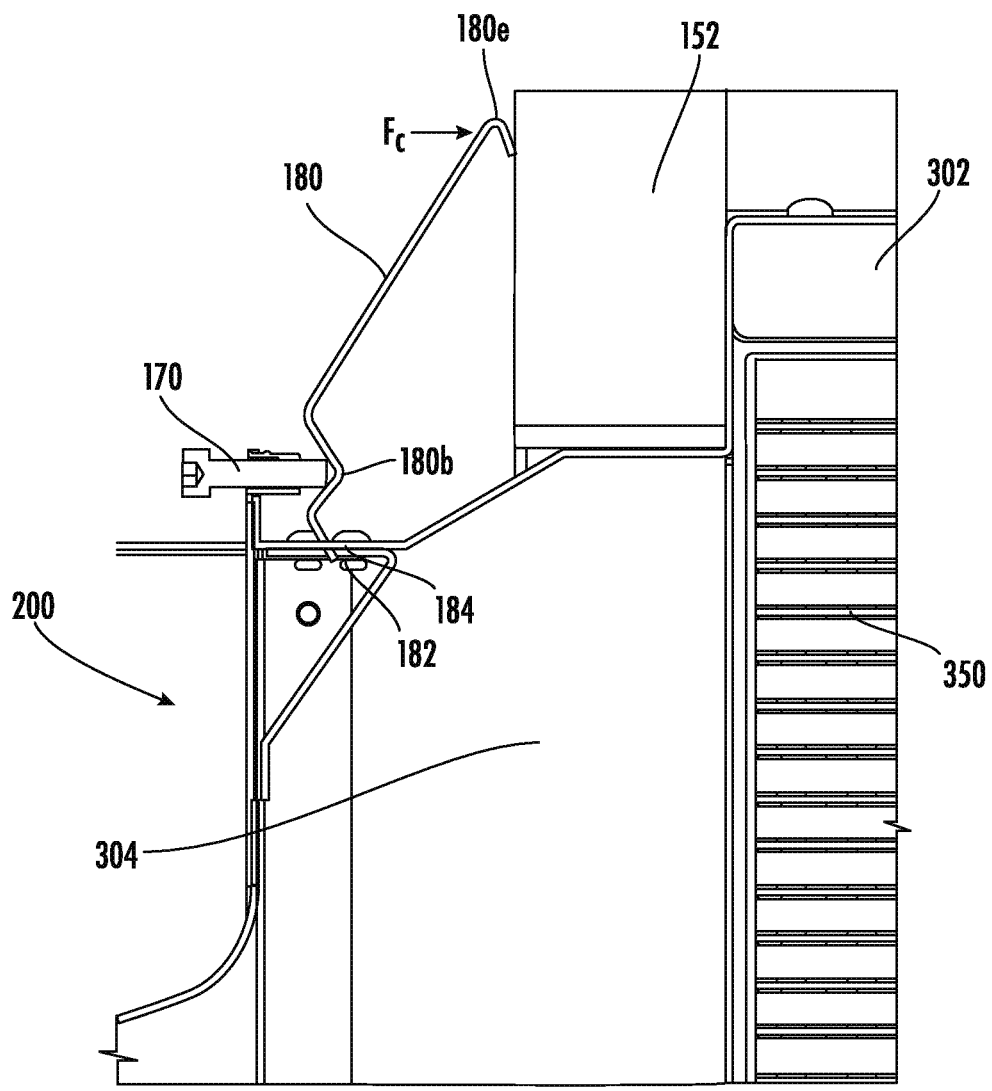
FIG. 11C is an enlarged top view of the attachment cleat of FIG. 11A.

In some embodiments, each of the attachment cleats 180 may further comprise a valley 180b extending along a length ($L_c$) of the attachment cleat 180 (see, e.g., FIG. 10A). As shown in FIGS. 11A-11C, the valley 180b in the attachment cleats 180 may be configured to receive one or more of the bolts 170 that secure the modular fan unit 200a-d to the filter housing unit 300. The clamping force $F_c$ of the attachment cleats 180 is applied through the plurality of bolts 170. As the bolts 170 are tightened, a greater clamping force $F_c$ is applied by the attachment cleat 180 onto the mounting structure 150 (e.g., the telecommunications cabinet door 152 in FIGS. 11A and 11C). The end 180e of the attachment cleat 180 digs into the skin of the telecommunications cabinet door 152 to prevent loosening of the system 100 from the mounting structure 150 (i.e., the cabinet door 152). In addition, the bolts 170 are received and bind into the channel of the valley 180b which further help to prevent loosening of the bolts 170 (and the system 100). As the bolts 170 are loosened, a lesser clamping force $F_c$ is applied by the attachment cleat 180 onto the mounting structure 150.

In some embodiments, the filter housing unit 300 may be a chassis to which the rest of the system 100 (i.e., the modular fan units 200a-d, and louvre units 400) are attached. As discussed above, each modular fan unit 200a-d may be bolted directly to the mating flanges 306 of the filter housing unit 300. The air filters 350 may rest in place within the individual filter compartments 300a-d until each louvre 400a-d is installed. The center of gravity of the filter housing unit 300 is within the thickness of the cabinet door 152 which allows the filter housing unit 300 to be rested in the opening 154 while an installer is secures the filter housing unit 300 to the door 152 with the cleats 180. Each element of the modular fan unit system 100 of the present invention being mechanically independent from one another allows the entire system 100 to be installed by one person.

Typically, existing fan systems are bolted directly into the telecommunications cabinet door 152 which provides a number of problems and/or disadvantages to using such systems, such as, for example, the system being difficult and awkward to assemble, requiring two or more installers to assist with installation, having a high risk of cross-threading, requiring the installers to drill holes through the cabinet door, having different bolting patterns for different capacity units, and access to the filters requiring the removal of the through bolts. The attachment cleats 180 of the present invention and methods of securing the modular fan unit system 100 of the present invention to a mounting structure 150 can overcome many of these disadvantages of existing fan systems.

Figure 12:
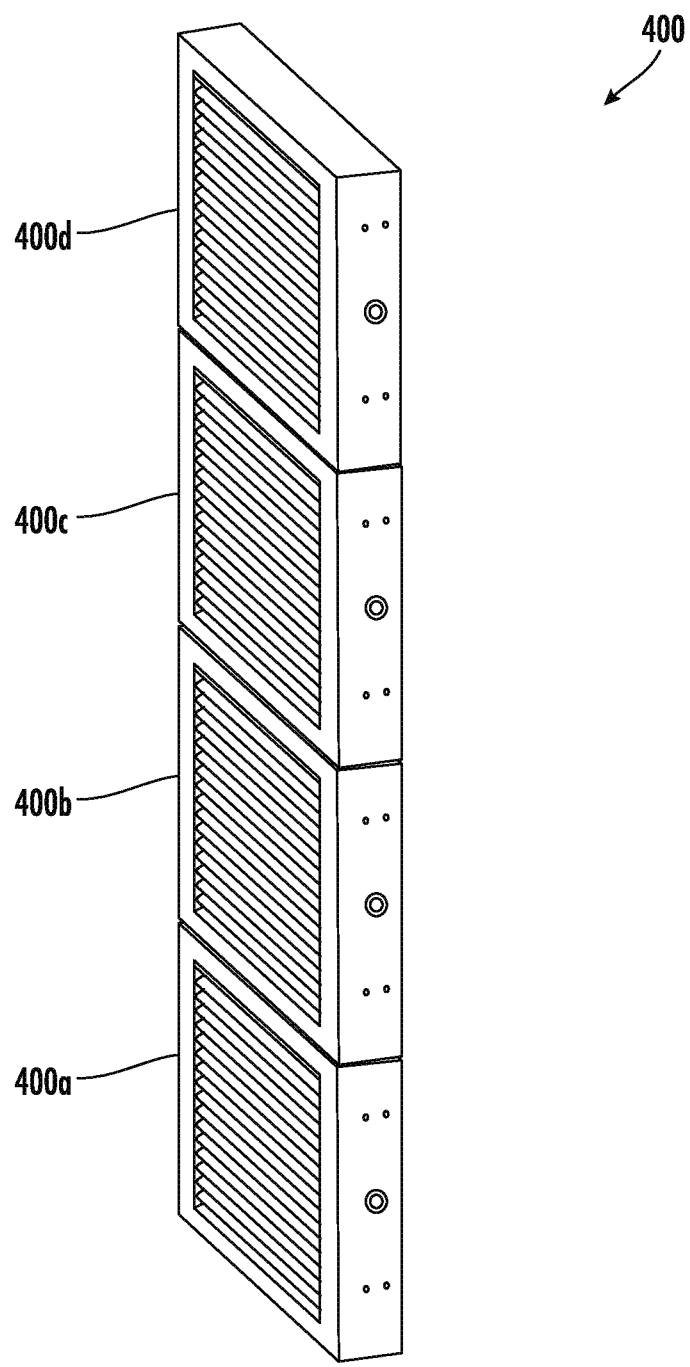
FIG. 12 is a side perspective view of a plurality of louvres of the modular fan unit system of FIG. 1 according to embodiments of the present invention.

Referring now to FIGS. 12-16, in some embodiments, the system 100 of the present invention may comprise a plurality of louvre units 400. The louvre units 400 allow air to enter the system 100, but help to keep water (i.e., rain) from entering the system 100. As shown in FIG. 12, similar to the module fan units 200a-d of the present invention, each louvre unit 400a-d may be configured to be stacked on top of another louvre unit 400a-d. As discussed in further detail below, each louvre unit 400a-d may be removably secured to the filter housing unit 300.

Figure 13A:
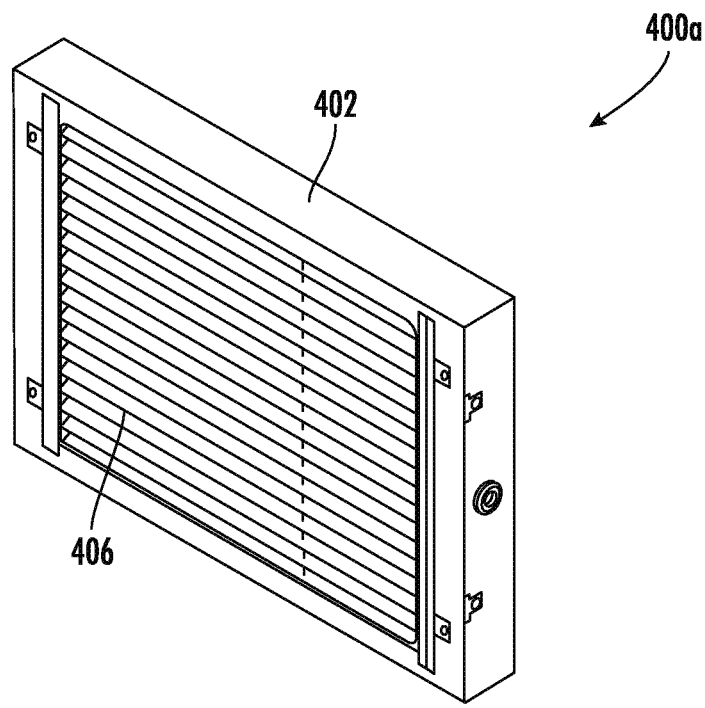
FIG. 13A is a side perspective view of an individual louvre of the plurality of louvres of FIG. 12 according to embodiments of the present invention.
Figure 13B:
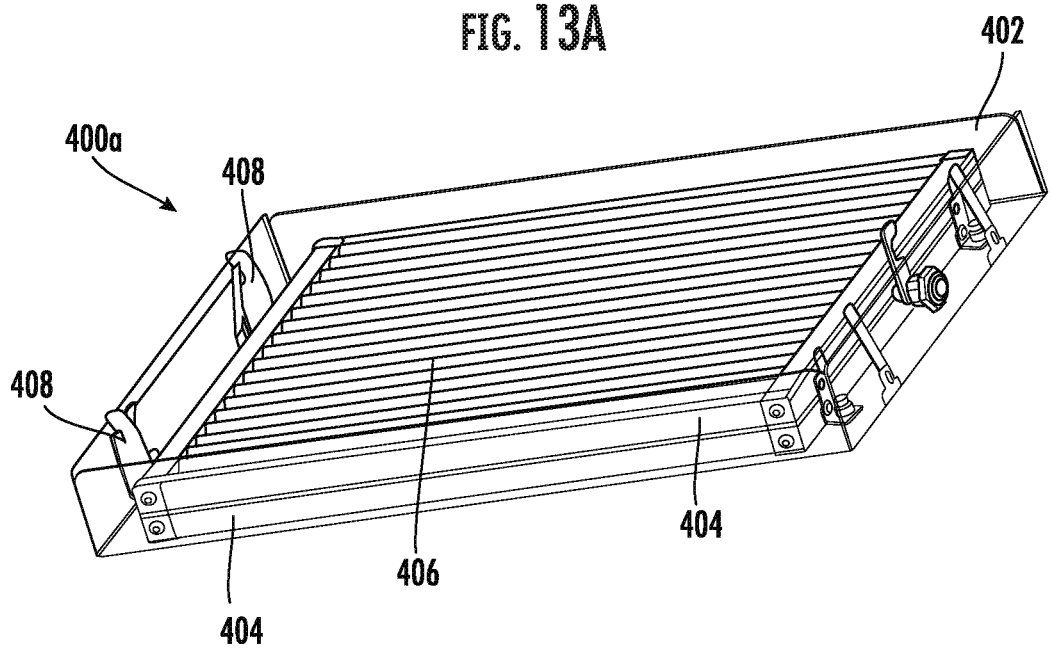
FIG. 13B is a rear perspective view of the louvre of FIG. 13A.

As shown in FIGS. 13A-13B, each louvre unit 400a-d comprises an outer housing 402 around the perimeter of the louvre unit 400a-d. The outer housing 402 is configured to house at least two internal blade banks 404. Each internal blade bank 404 includes a plurality of flat blades 406 angled within the housing 402.

In some embodiments, the at least two internal blade banks 404 may be layered within the louvre units 400a-d. When layered and enclosed within the outer housing 402, the internal blade banks 404a-c may be configured such that the blades 406 of the combined internal blade banks 404a-c are aligned in a chevron pattern (see, e.g., FIGS. 16A-16B). The chevron pattern of blades 406 creates a labyrinth for air to pass through before passing through the air filters 350 within the filter housing unit 300. The banks of blades 404a-c may be symmetrical and may be layered in opposing directions infinitely to increase the length of the labyrinth path. In some embodiments, to create the chevron pattern, a pair of blades 406 in adjacent internal blade banks 404 may be each angled (a) at about 45 degrees to form a 90 degree chevron (see, e.g., FIG. 16B).

Figure 14A:
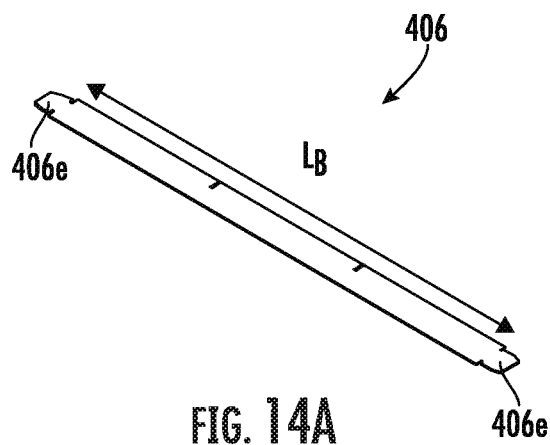
FIG. 14A is a perspective side view of a blade of the individual louvre of FIG. 13A according to embodiments of the present invention.
Figure 14B:
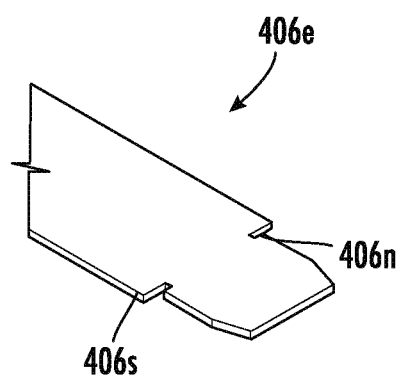
FIG. 14B is an enlarged perspective side view of the end of the blade of FIG. 14A.
Figure 15:
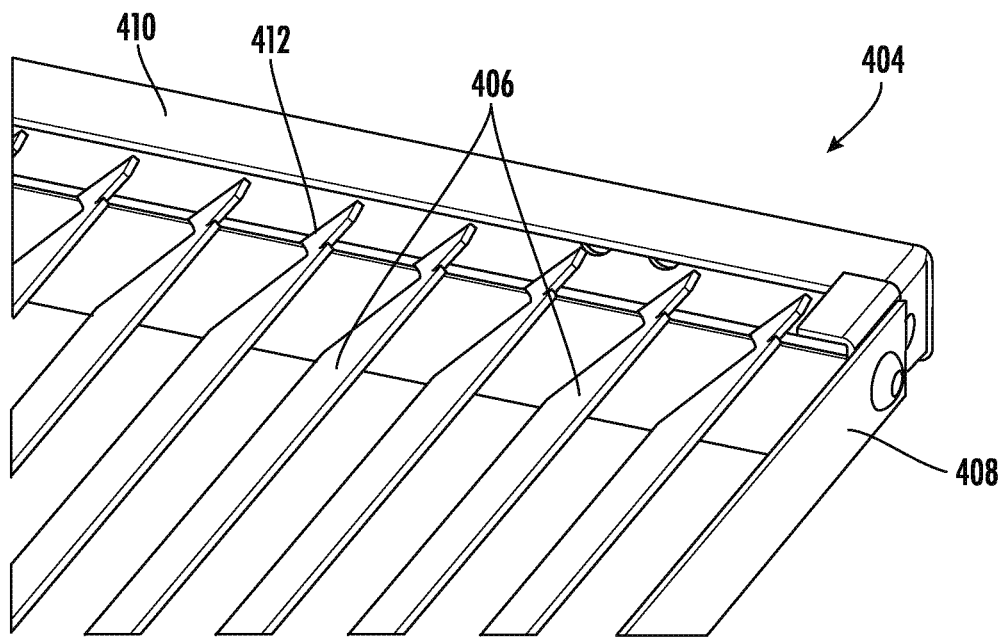
FIG. 15 is a partial enlarged view of a plurality of blades of FIG. 14A secured in the louvre of FIG. 13A.
Figure 16A:
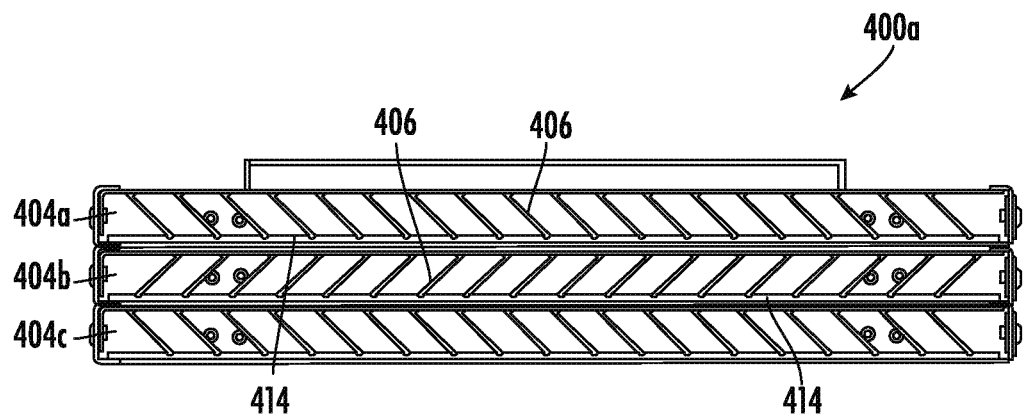
FIG. 16A is a top view of the individual louvre of FIG. 13A.
Figure 16B:
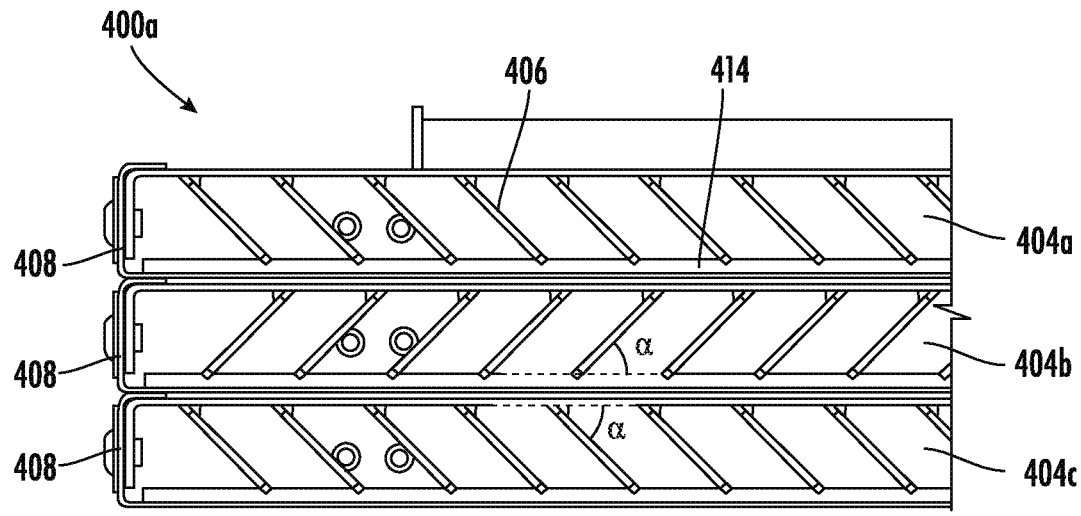
FIG. 16B is an enlarged view of the louvre of FIG. 16A.

In some embodiments, the blades 406 may comprise aluminum. For example, in some embodiments the blades 406 are formed from de-coiled aluminum strips. As shown in FIG. 14A-14B, in some embodiments, the blades 406 may comprise tapered ends 406e. In some embodiments, the tapered ends 406e may comprise a pair of notches 406n forming a pair of shoulders 406s. As shown in FIG. 15, in some embodiments, each tapered end 406e of a blade 406 may be configured to be received (and fixed) in respective slots 412 located along the sides 410 of each internal blade bank 404. The shoulder 406s of each tapered end 406e may abut against the outer housing 402 of the blade bank as the notches 406n secures the tapered end 406e within the respective slot 412. Distinguishable from louvres of existing fan systems, this configuration allows the internal blade banks 404a-c of the present invention to be formed without having to weld each individual blade 406 into place, thereby reducing manufacturing time and costs. In addition, the system 100 having banks of flat blades 406 (rather than blades already bent at 90 degrees) allows the banks of blades 406 to be powder coated more easily before assembly.

In some embodiments, each internal blade bank 404a-c includes a pair of end caps 408. The outer housing 402 of the internal blade banks 404a-c has its own integrity and the blades 406 may be retained within the banks 404a-c by the end caps 408. Each end cap 408 may be riveted in place. Other known methods of attaching the end caps 408 may be used. In some embodiments, each internal blade bank 404a-c may comprise a silicone sealant 414. In some embodiments, the silicon sealant 414 may be fireproof. During assembly of the internal blade bank 404a-c, as the end caps 408 are slid over the sides of each internal blade bank 404a-c, the bottom edge of each blade 406 within the blade bank 404a-c is pushed into the silicone sealant 414, further securing each blade within the blade bank 404a-c. The sealant 414 may mitigate or eliminate rattling of the blades 406 within the respective internal blade bank 404a-c.

Figure 17A:
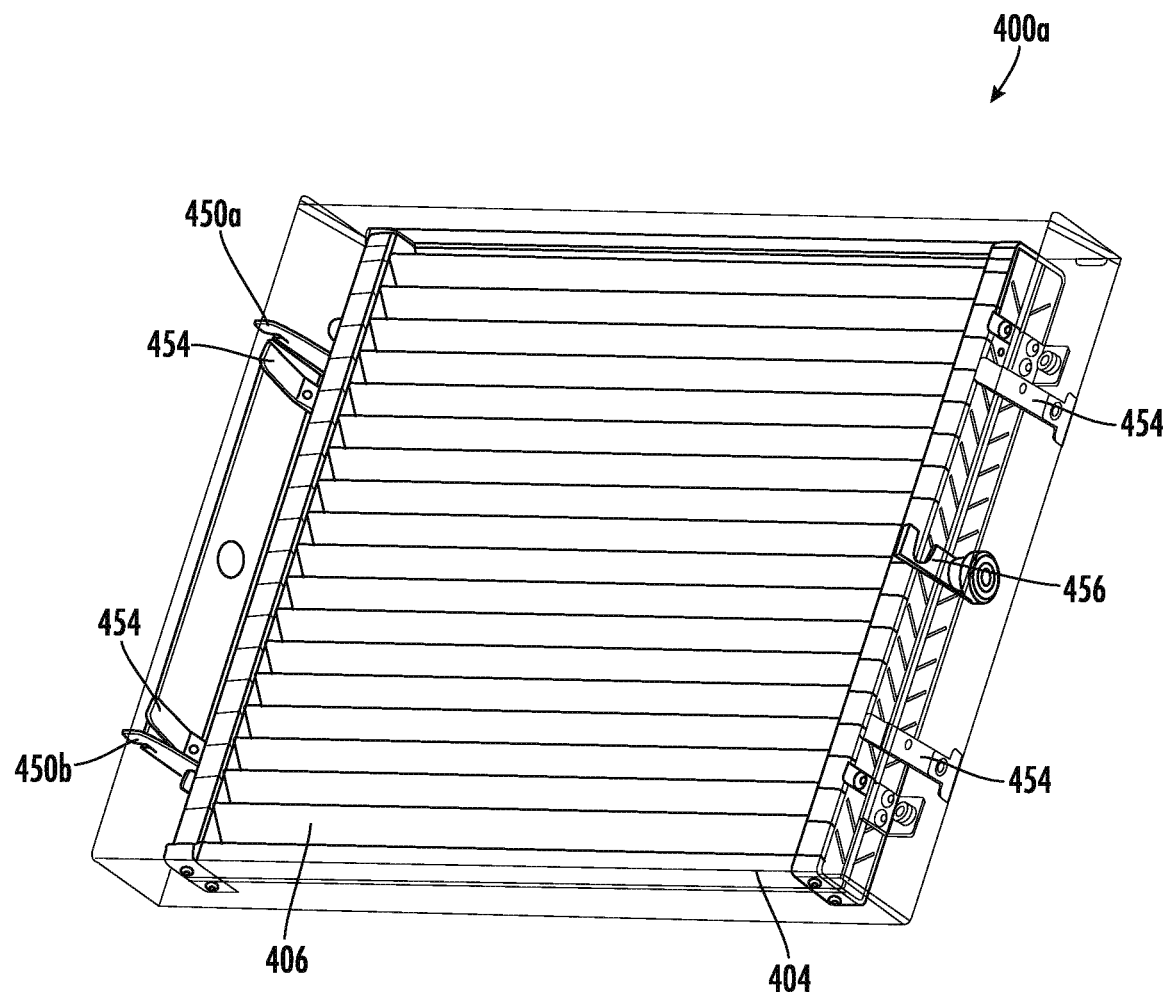
FIG. 17A is a rear perspective view of the individual louvre of FIG. 13A.
Figure 17B:
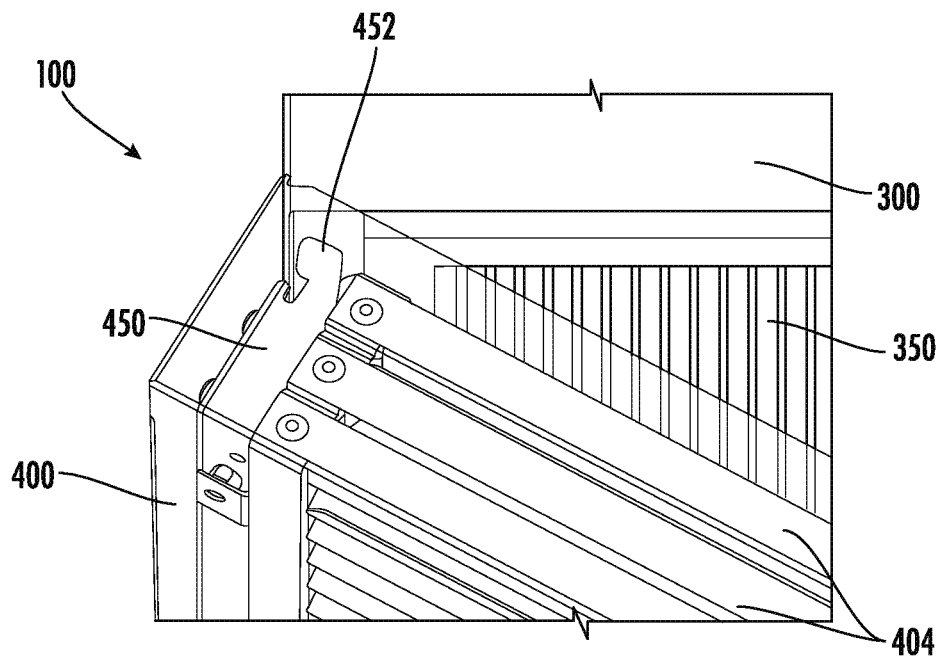
FIG. 17B is a top perspective view of a hinge of the louvre of FIG. 13A in an opened position according to embodiments of the present invention.
Figure 17C:
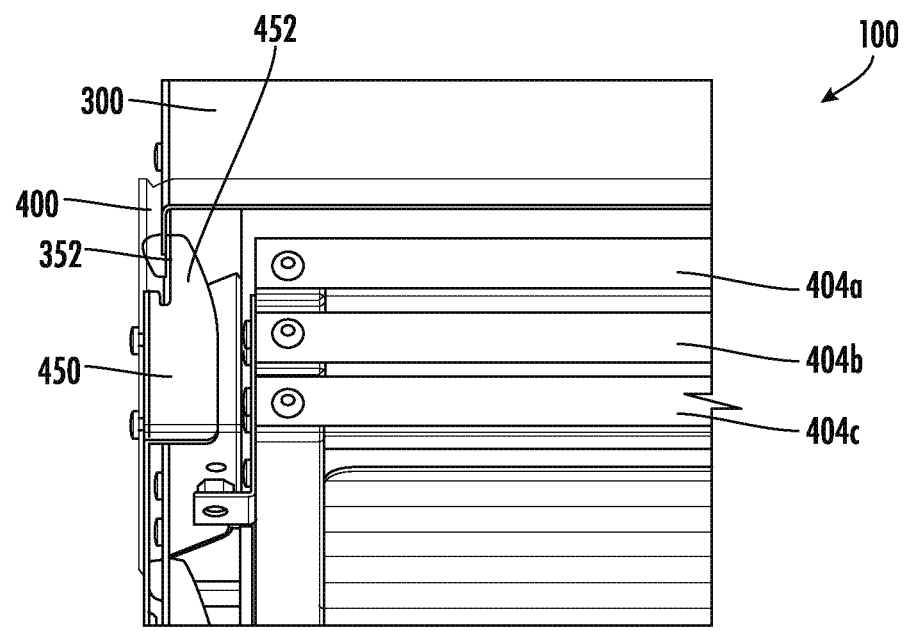
FIG. 17C is a top perspective view of the hinge of FIG. 17A in a closed position according to embodiments of the present invention.

Referring now to FIGS. 17A-17C, in some embodiments; each louvre unit 400a-d may be removably hinged to the front side of the filter housing unit 300. Each louvre unit 400a-d may comprise a pair of hinges 450 coupled to the outer housing 402 of each louvre unit 400a-d. In some embodiments, the hinges 450 may each comprise a hook 452. The pair of hinges 450 may be configured such that the hooks 452 may be received by respective slots 352 in the main body 302 of the filter housing unit 300. The pair of hinges 450 may allow each louvre unit 400a-d to pivot from an open position to a closed position, thus allowing or inhibiting access to the air filters 350 within the filter housing unit 300. In some embodiments, the pair of hinges 450 may also be configured to allow the louvre unit 400a-d to fully withdraw and be removed from the filter housing 300 to provide full access to the air filters 350 within the filter housing unit 300.

Similar to the module fan units 200a-d, each louvre unit 400a-d may have a rotational symmetry 180° about a rotational axis of the center of the louvre unit 400a-d. In some embodiments, the slots 352 and cutout (not shown) for the lock 456 may be present on both sides of the main body 302 of the filter housing 300. For example, if a louvre unit 400a-d is mounted upside down, the symmetrical hinges 450 and lock 456 are configured such that the louvre unit 400a-d may still be secured to the filter housing 300.

In some embodiments, as the louvre unit 400a-d pivots on the hinges 450, the hinges 450 pull the louvre unit 400a-d into the filter housing unit 300, pushing the louvre unit 400a-d against the air filter 350 within the filter housing unit 300. The louvre 400a-d compresses a foam gasket (not shown) residing along the inner wall of the main body 302 of the filter housing unit 300, thereby sealing the air filter 350 within the filter housing unit 300.

In some embodiments, each louvre unit 400a-d may comprise a plurality of spring tabs 454 within the outer housing 402 (FIG. 17A). The spring tabs 454 may be angled such that the tabs 454 push the louvre unit 400a-d away from the filter housing unit 300. The spring tabs 454 may be configured to provide additional centering and resistance against the air filters 350 within the filter housing unit 300. The spring tabs 454 may also help to center the louvre unit 400a-d and push the hinges 450 against the filter housing unit 300 allowing the louvre unit 400a-d to be secured to the filter housing unit 300 without an air filter 350 being present. In some embodiments, the spring tabs 454 opposing the hinges 450 may apply a greater force (e.g., resistance) to help ensure that the hinges 450 are secured against the main body 302 of the filter housing unit 300, thereby helping to mitigate or eliminate rattling of the louvre unit 400a-d against the filter housing unit 300. If the foam gasket degrades over time, the biasing of the spring tabs 454 further helps prevent the louvre unit 400a-d from rattling against the filter housing unit 300.

Figure 18:
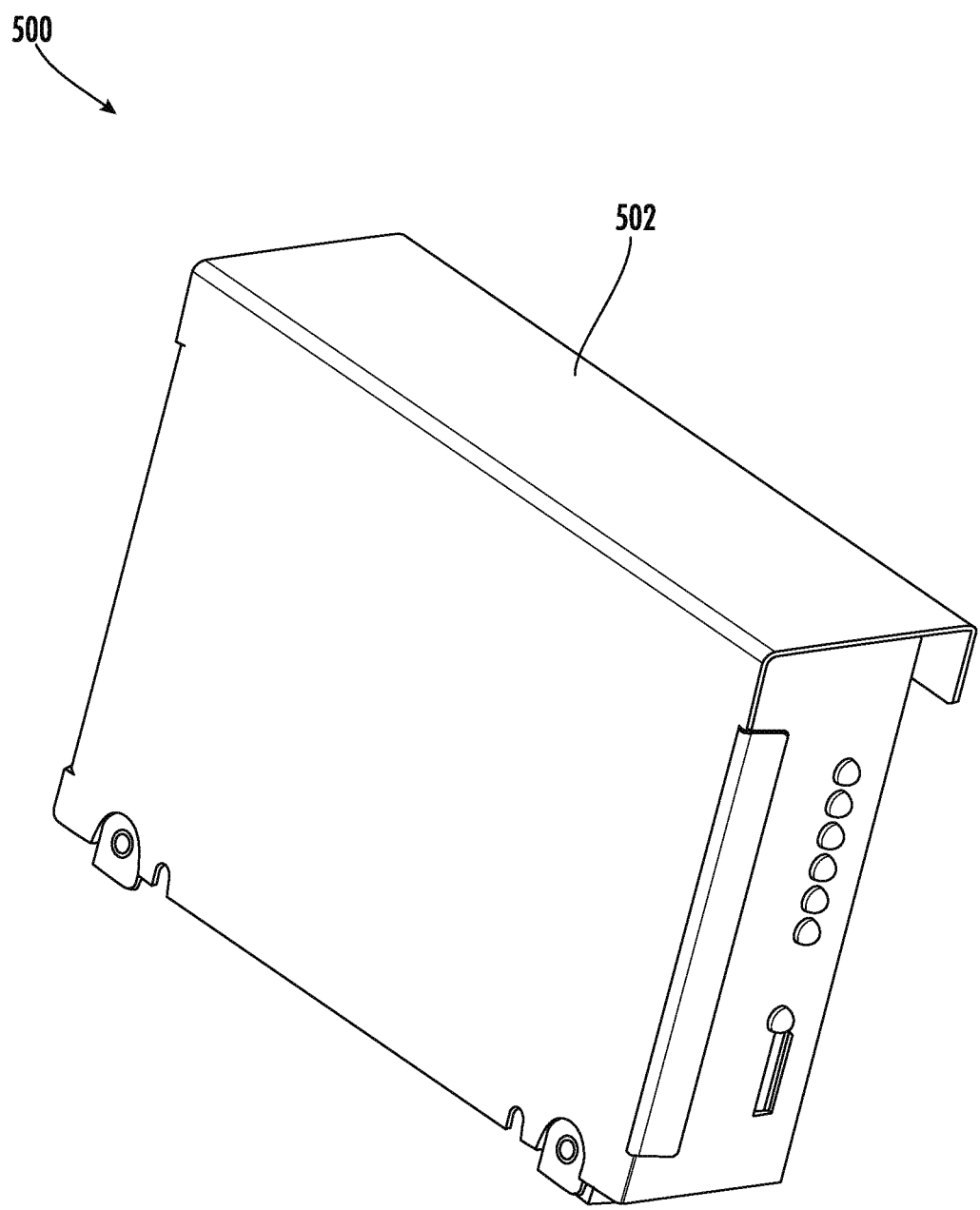
FIG. 18 is a top perspective view of a controller of the modular fan unit system of FIG. 1 according to embodiments of the present invention.

Referring to FIG. 18, in some embodiments, the system 100 of the present invention may comprise a controller 500. The controller 500 is communicatively coupled with each of the module fan units 200a-d and is configured to control the operation of the individual fans within each module fan unit 200a-d. The controller 500 is mounted inside a controller housing 502 that is separate and apart from the modular fan units 200a-d. As shown in FIGS. 1 and 5B, in some embodiments, the controller 500 may be located on top of the stacked module fan units 200a-d.

Methods of installing a modular fan unit system 100 of the present invention are also provided. In some embodiments, a method of installing the modular fan unit system 100 on a telecommunications cabinet door 152 may comprise (1) resting the filter housing unit 300 within the opening 154 of the telecommunications cabinet door 152; (2) securing the filter housing unit 300 to the telecommunications cabinet door 152 with attachment cleats 180; (3) securing each modular fan unit 200a-d to flanges 306 on the filter housing unit 300; (4) inserting air filters 350 into each individual filter compartment 300a-d of the filter housing unit 300; and (5) securing each louvre 400a-d to the filter housing unit 300 via hinges 450.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A louvre unit for a fan unit system, the louvre unit comprising:
   at least two internal blade banks, each internal blade bank having a length and a width;
   a plurality of blades extending the width of each internal blade bank, ends of each blade being configured such that each end is received by and secured in a respective slot along the length of a respective internal blade bank; and
   an end cap at each end of the width of each internal blade bank,
   wherein the at least two internal blade banks are layered such that the plurality of blades of the combined internal blade banks are aligned in a chevron pattern for air to pass through the louvre unit.

2. The louvre unit of claim 1, wherein the plurality of blades comprise aluminum.

3. The louvre unit of claim 1, wherein each end of each blade is tapered having a pair of notches to be received by and secured in the respective slot along the length of the respective internal blade bank.

4. The louvre unit of claim 1, wherein a bottom edge of each blade is secured in place within the respective internal blade bank by a silicone sealant.

5. The louvre unit of claim 1, further comprising a pair of hinges.

6. The louvre unit of claim 5, wherein the pair of hinges is configured to allow the louvre unit to pivot and fully withdraw from a filter housing when mounted thereto.

7. The louvre unit of claim 1, wherein a pair of the plurality of blades in adjacent internal blade banks are each angled at about 45 degrees to form a 90-degree chevron.

8. The louvre unit of claim 1, wherein the louvre unit has a rotational symmetry 180 degrees about a rotational axis of the center of the louvre unit.

9. A louvre unit for a fan unit system, the louvre unit comprising:
   at least two internal blade banks, each internal blade bank having a length and a width;
   a plurality of blades extending the width of each internal blade bank, ends of each blade being configured such that each end is received by and secured in a respective slot along the length of a respective internal blade bank, wherein the at least two internal blade banks are layered such that the plurality of blades of the combined internal blade banks are aligned in a chevron pattern for air to pass through the louvre unit;
   an end cap at each end of the width of each internal blade bank,
   an outer housing configured to hold the at least two internal blade banks; and
   a pair of hinges coupled to the outer housing and configured to allow the louvre unit to pivot and fully withdraw from a filter housing when mounted thereto.

10. The louvre unit of claim 9, wherein a bottom edge of each blade is secured in place within the respective internal blade bank by a silicone sealant.

11. The louvre unit of claim 9, wherein each hinge comprises a hook configured to be received by corresponding slots in a filter housing unit.

12. The louvre unit of claim 9, wherein the louvre unit has a rotational symmetry 180 degrees about a rotational axis of the center of the louvre unit.

13. A method of installing a modular fan unit system for a telecommunications cabinet, the method comprising:
provyding a telecommunications cabinet door;
providing a modular fan unit system including a plurality of modular fan units, a filter housing unit having a plurality of filter compartments, and a plurality of louvre units;
resting the filter housing unit within an opening of the telecommunications cabinet door;
securing the filter housing unit to the telecommunications cabinet door, wherein the filter housing unit is secured to the telecommunications cabinet door by a pair of attachment cleats, wherein each attachment cleat is configured to interlock with the filter housing unit such that attachment cleats apply a clamping force to the telecommunications cabinet door;
securing each modular fan unit to flanges on the filter housing unit;
inserting air filters into respective individual filter compartments of the filter housing unit; and
securing each louvre unit to the filter housing unit.

14. The method of claim 13, wherein each attachment cleat interlocks with the filter housing unit through a plurality of slots in the filter housing unit.

15. The method of claim 13, wherein each of the attachment cleats comprises a valley extending a length of the attachment cleat, the valley configured to receive one or more bolts such that tightening or loosening of the one or more bolts corresponds to the amount of clamping force applied to the telecommunications cabinet door.

16. The method of claim 13, wherein each louvre unit is secured to the filter housing unit by a pair of hinges coupled to an outer housing of the louvre unit configured to allow the louvre unit to pivot and fully withdraw from the filter housing unit when mounted thereto.

\* \* \* \* \*